US012344747B1

(12) United States Patent
Ahmed et al.

(10) Patent No.: US 12,344,747 B1
(45) Date of Patent: Jul. 1, 2025

(54) METHOD AND SYSTEM FOR PRODUCING LIGHT OF SPECIFIED WAVELENGTH

(71) Applicant: IMAM MOHAMMAD IBN SAUD ISLAMIC UNIVERSITY, Riyadh (SA)

(72) Inventors: Khalid Hassan Ibnaouf Ahmed, Riyadh (SA); Hajo Idriss Mohammed Idriss, Riyadh (SA); Osamah Abdulrahman Aldaghri, Riyadh (SA)

(73) Assignee: IMAM MOHAMMAD IBN SAUD ISLAMIC UNIVERSITY, Riyadh (SA)

( * ) Notice: Subject to any disclaimer, the term of this patent is extended or adjusted under 35 U.S.C. 154(b) by 0 days.

(21) Appl. No.: 19/039,497

(22) Filed: Jan. 28, 2025

(51) Int. Cl.
*C09B 11/24* (2006.01)
*C09B 3/12* (2006.01)
*H01S 5/00* (2006.01)

(52) U.S. Cl.
CPC ............... *C09B 11/24* (2013.01); *C09B 3/12* (2013.01); *H01S 5/0087* (2021.01)

(58) Field of Classification Search
CPC .......... C09B 3/12; C09B 11/24; H01S 5/0087
See application file for complete search history.

(56) References Cited

U.S. PATENT DOCUMENTS

| 6,558,958 | B1 | 5/2003 | Pilevar et al. | |
|---|---|---|---|---|
| 9,246,300 | B2* | 1/2016 | LaComb | H01S 3/08 |
| 2008/0159351 | A1* | 7/2008 | Li | H01S 3/213 |
| | | | | 372/20 |

FOREIGN PATENT DOCUMENTS

PL 165889 B1 2/1995

OTHER PUBLICATIONS

Jaison Peter, et al., "Solvent effects on lasing characteristics for Rh B laser dye.", Journal of Luminescence, vol. 169, Part A, Jan. 2016, pp. 227-232, 11 pages.

(Continued)

*Primary Examiner* — Abdulmajeed Aziz
*Assistant Examiner* — Nathaniel J Lee
(74) *Attorney, Agent, or Firm* — Oblon, McClelland, Maier & Neustadt, L.L.P.

(57) ABSTRACT

A method for producing light of a specified wavelength includes irradiating a dye solution present in a cuvette with a semiconductor diode laser source to emit laser light. A system for producing a light of a specified wavelength includes a semiconductor diode laser source, an optical chopper, a cylindrical lens, a dye preparation unit, a grating, and a dye solution pump. The dye preparation unit includes a rotator and a cuvette loaded with a dye solution, which includes a dye solution. The dye solution comprises a natural oil selected from moringa, avocado, almond, castor, pumpkin, lemon oils, or combinations thereof, with dissolved dye at concentrations of 1-3 μg/mL. This configuration enables enhanced amplified spontaneous emission intensity at elevated temperatures while maintaining photochemical stability.

20 Claims, 33 Drawing Sheets

(56) References Cited

OTHER PUBLICATIONS

Oscar Javier Zapata-Nava, et al., "Grating cavity dual wavelength dye laser", Optics Express, vol. 19, Issue 4, Feb. 14, 2011, pp. 3483-3493.
O. Prakash, et al., "A study on the control of dye solution temperature on the line-width and wavelength stability of a copper vapour laser pumped single mode dye laser", Optics Communications, vol. 283, Issue 24, Dec. 15, 2010, pp. 5099-5106, 6 pages.
M. Boni, et al., "Enhanced fluorescence emitted by microdroplets containing organic dye emulsions", Biomicrofluidics. vol. 9, Issue 1, Feb. 24, 2015, pp. 014126-1 to 014126-10.

* cited by examiner

METHOD AND SYSTEM FOR PRODUCING LIGHT OF SPECIFIED WAVELENGTH

BACKGROUND

Technical Field

The present disclosure relates to laser technology and optoelectronic systems, and more particularly to a laser system that utilizes thermal effects and integrated temperature control to enhance performance characteristics of dye-based and polymer-based laser media. The present disclosure pertains to methods and systems for producing light of a specified wavelength through thermal management of natural oil-based gain media.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Laser dyes represent an important class of tunable and readily accessible coherent light sources, finding widespread applications in fields such as spectroscopy and medical treatment. These systems typically employ dyes as active gain media, with the dye molecules traditionally being dissolved in volatile organic solvents such as ethanol, methanol, or benzene to facilitate energy transfer mechanisms. The selection of appropriate dye compounds is required, as different dye molecules produce distinct emission spectra, enabling laser output to be tuned across a broad wavelength range. The ability to tune laser dye over an extended range is one of the reasons why dye lasers are so frequently used in research and industry.

However, there are several complications associated with the operation of laser dyes, particularly with thermal management. Once the dye solution is actively pumped by a powerful light source (e.g., a flashlamp) or another laser, the absorption of energy results in the heating of the dye solution. Heat must then be managed in the system to avoid unintended consequences, including photochemical degradation of the dye molecule due to exposure to high power. During the use of the dye, photochemical degradation can lead to decreases in the emission efficiency of the dye throughout the experiment. Decreased efficiencies lead to a decreased optical output power of the laser and a change in the emission wavelength during operation.

Typically, unsuccessful excitations of the dye can create complex breakdown products that continue to drive reductions in performance efficiency while interrupting the action of dye molecules. Thermal gradients within the dye media itself can induce changes in the refractive index to yield what is known as the thermal lens effect which can manifest itself in distortion of the beam profile decreasing the quality and stability of the laser output. In high dye applications, the heating can introduce a large thermal lens effect and therefore needs an elaborate cooling apparatus that acts to reverse heating of the dye benefits in maintaining beam quality. In addition, if the heat produced in the dye solution does not dissipate sufficiently, the solvent may reach a temperature at which it boils, causing bubbles to develop. Bubbles scattering the laser light and cavitation resulting in possible damage to the laser cell and/or other optical components can lead to erratic laser output power and/or wavelength, which is not desired laser operation.

Dye lasers, due to these reasons, are typically designed to have a sophisticated cooling system. For example, the dye solution is frequently circulated through a heat exchanger after it has been cooled to a temperature before returning it to the laser cell, and the dye solution's flow rate is also controlled so that more or fewer uniform temperatures are achieved throughout the dye solution preventing hot spots. Hot spots produce thermal degradation and eventually boiling inside the laser cell causing bubbling and cavitation problems. Some system receives direct cooling with a jacket cooling system to achieve optimal temperature control. Additionally, the dye laser cavity and optical components will work to obtain an optimal working state. For instance, good optics having a low absorption coefficient are designed and used to minimize how much heat is generated inside the cavity of the laser cell. Furthermore, utilizing aperture or wavelength selective mirrors, filters, or gratings can also provide methods that reject unwanted wavelengths that contribute to increased heat load and only incorporate the wavelengths that are desired.

However, these cooling-based solutions add complexity and cost while not fully addressing the fundamental thermal management challenges. Balancing energy input, heat generation, and cooling efficiency will enable the successful operation of the dye laser. Through diligence and control of the aforementioned variables, a consistently high-power laser can be produced over a sizable range of wavelengths. This unique ability makes dye lasers an extremely powerful tool in numerous scientific and industrial fields. Indeed, operating a laser dye system in the absence of effective cooling is one of the larger obstacles in the commercial use of dye lasers. There exists a need in the art for improved laser systems that can effectively manage thermal effects while enhancing rather than simply mitigating their impact on laser performance.

PL165889B1 describes a dual-band diagnostic and therapeutic laser system incorporating a dye laser equipped with a two-color cuvette positioned between mirrors forming a flat-flat resonator. The system utilizes a cylindrical lens to shape the laser beam and directs it through the dye-filled cuvette to generate specific wavelengths of light for diagnostic and therapeutic applications. However, this system lacks active temperature control integration with heating capability and relies solely on conventional cooling approaches.

U.S. Pat. No. 6,558,958B1 describes an optical fiber-based fluorosensor system utilizing a 785-nm semiconductor diode laser source and an optical chopper configuration for controlled beam modulation. The system incorporates a cylindrical lens for beam shaping and focuses on room-temperature operation with conventional dye-solvent combinations. However, this system does not address thermal enhancement strategies or utilize natural oil-based solvents for improved stability.

Jaison Peter et al. [See: Peter, J. et al., Solvent effects on lasing characteristics for Rh B laser dye, *Journal of Luminescence,* 169, 2016, 227-232] investigates solvent effects on Rhodamine B laser characteristics, demonstrating pulsed photopumped multimode laser emission using an Nd:YAG laser operating at 10 Hz with 8 ns pulse duration. The reference examines dye behavior in conventional organic solvents within standard quartz cuvettes under controlled conditions. However, the reference does not explore active thermal management strategies or natural oil-based solvent systems.

Zapata-Nava et al. [See: Zapata-Nava et al., Grating cavity dual wavelength dye laser, *Optics Express*, 2019, 4, 3483-3493] explores dual wavelength dye laser configurations utilizing Littman-Metcalf and Littrow cavity arrangements, implementing grating-based wavelength selection with dye solutions circulating through quartz cells. The reference demonstrates wavelength tunability through grating rotation while maintaining conventional thermal management approaches. However, the reference lacks integrated active temperature control apparatus utilizing both heating and cooling capabilities.

Prakash et al. [See: Prakash et al., A study on the control of dye solution temperature on the line-width and wavelength stability of a copper vapour laser pumped single mode dye laser, *Optics Communications*, 283, 24, 2010, 5099-5106] examines the effects of dye solution temperature control on laser performance, specifically investigating line-width and wavelength stability in copper vapor laser-pumped systems. The reference highlights the importance of precise temperature regulation but remains focused on conventional cooling strategies. However, the reference does not utilize natural oils as solvents or implement strategic thermal enhancement methods.

Each of the aforementioned references suffers from one or more drawbacks hindering their adoption, such as lack of a comprehensive system that achieves enhanced performance characteristics through strategic thermal management. Accordingly, it is one object of the present disclosure to provide improved laser systems that can effectively manage thermal effects while enhancing rather than simply mitigating their impact on laser performance. Such systems should provide precise thermal control while reducing complexity and operational costs compared to conventional cooling-based approaches.

SUMMARY

In an exemplary embodiment, a method for producing light of a specified wavelength is described, comprising: irradiating a dye solution present in a cuvette with a semiconductor diode laser source to emit a laser light including an output wavelength of light; modulating the laser light with an optical chopper; shaping the laser light with a cylindrical lens; rotating the cuvette, during the irradiating, with a rotator to mix the dye solution; controlling the temperature of the cuvette, during the irradiating, with an active temperature control apparatus; transmitting the output wavelength of light using a grating to produce an output light; and directing the output light toward a target, wherein the dye solution comprises a natural oil selected from the group consisting of moringa, avocado, almond, castor, pumpkin, lemon, and combinations thereof, in a major amount, and a dye.

In some embodiments, the oil is lemon oil and the dye is poly(9,9-didodecylfluorenyl-2,7-diyl)-end-capped with dimethylphenyl.

In some embodiments, the concentration of poly(9,9-didodecylfluorenyl-2,7-diyl)-end-capped with dimethylphenyl in the lemon oil is in a range from 1 to 3 µg/mL.

In some embodiments, the temperature is 20° C. and there is a measurable amplified spontaneous emission (ASE) intensity.

In some embodiments, the temperature is 80° C. and the ASE intensity is greater than or equal to 105% of the ASE intensity at 20° C.

In some embodiments, the temperature is 100° C. and the ASE intensity is greater than or equal to 115% of the ASE intensity at 20° C.

In some embodiments, the temperature is 130° C. and the ASE intensity is greater than or equal to 120% of the ASE intensity at 20° C.

In some embodiments, the temperature is 170° C. and the ASE intensity is greater than or equal to 125% of the ASE intensity at 20° C.

In some embodiments, the method further comprises maintaining photochemical stability for 2000 or greater pulses, where the photochemical stability is defined as maintaining an ASE at greater than or of equal to 95% of an initially measured value.

In some embodiments, the photochemical stability is maintained for 3000 or greater pulses.

In some embodiments, the photochemical stability is maintained for 4000 or greater pulses.

In some embodiments, the oil is castor oil and the dye is rhodamine B.

In some embodiments, the concentration of rhodamine B in castor oil is in a range from 1 to 3 µg/mL.

In another exemplary embodiment, a system for producing a light of a specified wavelength is described, comprising: a semiconductor diode laser source, an optical chopper, a cylindrical lens, a dye preparation unit, a grating, and a dye solution pump; wherein the semiconductor diode laser source is configured to emit and direct laser light toward the optical chopper; wherein the optical chopper is configured to modulate the laser light by pulsing the light at intervals and to direct the laser light toward the cylindrical lens; wherein the cylindrical lens is configured to shape the laser light and direct the laser light toward the dye preparation unit; wherein the dye preparation unit comprises: a cuvette, loaded with a dye solution, which comprises a dye dissolved in an oil selected from the group consisting of moringa, avocado, almond, castor, pumpkin, lemon, and combinations thereof; a rotator, wherein the rotator is configured to rotate the cuvette; and an active temperature control apparatus configured to monitor and maintain a stable temperature within the cuvette utilizing active heating and cooling; wherein the dye preparation unit is configured such that the laser light passes through the dye solution and excites the dye, thereby emitting dye-emitted light and the laser light and the dye-emitted light combine to produce an enriched laser light; wherein the grating is configured to selectively transmit a desired wavelength of light to produce an output light, and direct the output light toward a target; and wherein the dye solution pump is configured to pump dye solution from a dye solution reservoir, through a sample line, through the cuvette, through a waste line, and into to a waste container.

In some embodiments, the oil is lemon oil and the dye is poly(9,9-didodecylfluorenyl-2,7-diyl)-end-capped with dimethylphenyl.

In some embodiments, the concentration of poly(9,9-didodecylfluorenyl-2,7-diyl)-end-capped with dimethylphenyl in the lemon oil is in a range from 1 to 3 µg/mL.

In some embodiments, the system is capable of maintaining photochemical stability for 2000 or greater pulses, where the photochemical stability is defined as maintaining an ASE at greater than or of equal to 95% of an initially measured value.

In some embodiments, the photochemical stability is maintained for 4000 or greater pulses.

In some embodiments, the oil is castor oil and the dye is rhodamine B.

In some embodiments, the concentration of rhodamine B in castor oil is in a range from 1 to 3 µg/mL.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
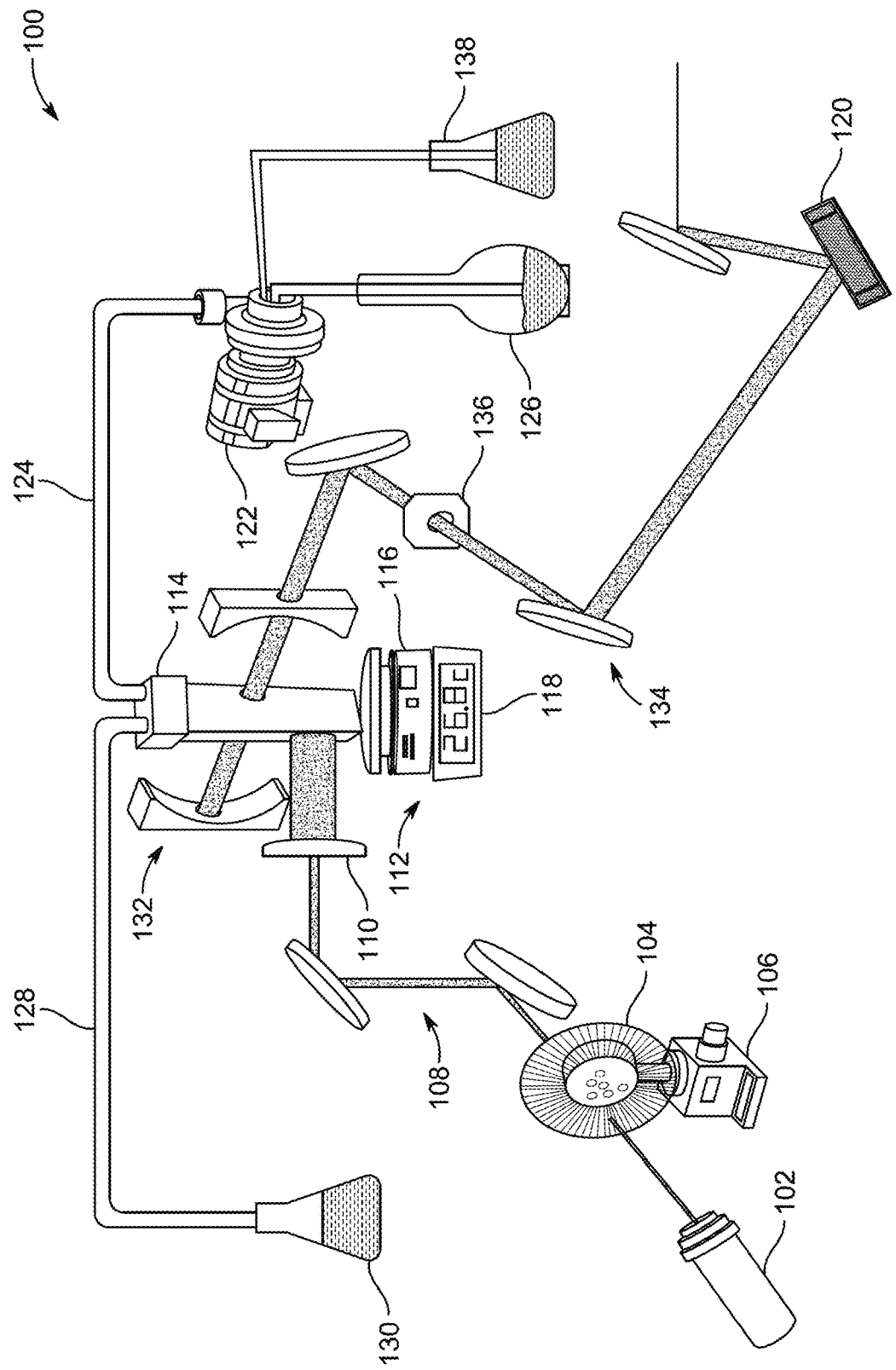
FIG. 1 is an exemplary diagram of a system depicting its operations for producing light of a specified wavelength, according to certain embodiments.

In the drawings, like reference numerals designate identical or corresponding parts throughout the several views.

Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

"Amplified spontaneous emission" (ACE) as used herein is defined as light produced by spontaneous emission that has been optically amplified in a gain medium by the process of stimulated emission. ASE is typically produced when a laser gain medium is pumped to produce a population inversion.

Aspects of this disclosure are directed to a method and a system for producing light of a specified wavelength. A traditional challenge in laser systems has been managing thermal effects due to heat generation while maintaining stable operation. Conventional approaches typically focus on complex cooling mechanisms to mitigate thermal impacts, leading to increased system complexity and operational costs. The present disclosure addresses these limitations through strategic thermal management by incorporating natural oils as solvents combined with active temperature control. This approach enables enhanced performance characteristics while reducing system complexity. The disclosed method and system achieve improved operational stability through precise thermal regulation and optimized energy transfer mechanisms, particularly beneficial in applications requiring sustained high-performance operation such as spectroscopy and medical treatments.

Referring to FIG. 1, illustrated is a schematic diagram of a system (as represented by reference numeral 100) for producing light of a specified wavelength. The system 100 of the present disclosure provides controlled emission of coherent radiation through strategic integration of optical and thermal management components. The system 100 enables precise wavelength selection and beam manipulation while maintaining optimal thermal conditions for sustained operation. The system 100 is further configured to maintain consistent performance characteristics through active thermal management and strategic solvent selection. It may be appreciated that, as used herein, "light" refers to electromagnetic radiation generated through stimulated emission processes, specifically including both laser light produced by the semiconductor diode laser source and dye-emitted light produced through excitation of the dye solution, which combine to form enriched laser light. Further, the term "specified wavelength" refers to a selected output wavelength or range of wavelengths produced by the system 100 through selective transmission of the enriched laser light. Herein, the wavelength selection is achieved through precise control of system parameters including dye selection, temperature regulation, and grating configuration. The system 100 of the present disclosure may be implemented for various applications, including, but are not limited to, spectroscopic analysis, medical diagnostics, industrial processing, and scientific research where precisely controlled wavelength emission is required.

As illustrated, the system 100 includes a semiconductor diode laser source 102 configured to emit and direct laser light toward an optical chopper 104. The semiconductor diode laser source 102 is positioned at the input end of the system 100 and functions as the primary excitation source. The semiconductor diode laser source 102 generates high-power laser radiation specifically optimized for dye excitation applications, operating with precisely controlled pulse energies of 6 mJ and maintaining a stable repetition rate of 10 Hz. The beam characteristics of the semiconductor diode laser source 102 are engineered to maximize energy transfer efficiency to the dye solution, with the output wavelength selected to align with optimal absorption bands of the target dye compounds. The semiconductor diode laser source 102 incorporates integrated thermal management systems and power stabilization circuits to maintain consistent output characteristics throughout extended operation periods. The positioning and orientation of the semiconductor diode laser source 102 are precisely calibrated to establish optimal beam trajectory through subsequent optical components, with multi-axis adjustment capabilities enabling fine-tuning of beam alignment parameters.

The optical chopper 104 is positioned in the optical path of the laser light emitted by the semiconductor diode laser source 102. The optical chopper 104 includes a precision-engineered rotating disc incorporating systematically spaced apertures, driven by a controlled motor mechanism 106 capable of maintaining stable rotation speeds between 1-100 Hz. The aperture configuration of the optical chopper 104 is specifically designed to generate modulated light pulses with characteristics optimized for dye excitation processes. The controlled motor mechanism 106 incorporates closed-loop feedback control systems to maintain precise rotation speeds with variation less than ±0.1%. The optical chopper 104 may include integrated synchronization capabilities to coordinate pulse timing with other system components. A first mirror setup 108 is positioned to receive the modulated laser light from the optical chopper 104, featuring surface accuracy of $\lambda/10$ at the operating wavelength and reflectivity exceeding 99.5%. The first mirror setup 108 incorporates precision mounting mechanisms with multi-axis adjustment capabilities, enabling angular resolution of 0.1 mrad for precise beam steering.

The system 100 further includes a cylindrical lens 110 positioned to receive modulated laser light redirected by the first mirror setup 108. The cylindrical lens 110 is designed with specific focal characteristics to shape the incident laser beam into a line configuration optimized for uniform dye excitation. For present purposes, the cylindrical lens 110 is fabricated from high-purity optical material with transmission efficiency exceeding 98% at the operating wavelength range of 350-800 nm. A mounting system is employed for the cylindrical lens 110, which incorporates translation stages enabling accurate positioning along three axes with resolution of 10 μm. In an example configuration of the present disclosure, the cylindrical lens 110 produces a focused line with dimensions of 0.2 mm×4 mm, creating optimal energy density distribution for efficient dye excitation.

The system 100 further includes a dye preparation unit 112 positioned to receive the shaped laser light from the cylindrical lens 110. The dye preparation unit 112 is configured such that the emitted laser light and dye-emitted light combine within a controlled environment to produce enriched laser light with enhanced spectral characteristics. The dye preparation unit 112 enables controlled preparation and delivery of laser active media through integration of multiple functional subsystems. As illustrated, the dye preparation unit 112 includes a cuvette 114, a rotator 116, and an active temperature control apparatus 118, integrated into a unified assembly for optimal performance. Through such integration of mechanical, thermal, and optical subsystems, the dye preparation unit 112 enables continuous operation while maintaining stable temperature profiles, uniform solution mixing, and consistent optical path geometries required for sustained laser performance.

The cuvette 114 is fabricated from high-quality quartz material with optical transmission characteristics exceeding 95% across the operational wavelength range. The cuvette 114 includes precisely parallel windows with surface flatness of $\lambda/4$ and maintains internal dimensions of 1 cm path length. The cuvette 114 is loaded with a dye solution comprising a dye compound dissolved in a natural oil selected from moringa oil, avocado oil, almond oil, castor oil, pumpkin oil, lemon oil, or combinations thereof. Herein, the dye concentration is precisely maintained between 1-3 μg/mL. The selection of natural oils as solvents enables enhanced thermal stability and improved photochemical performance compared to conventional organic solvents, with demonstrated stability at operating temperatures up to 180° C.

The rotator 116 is mechanically coupled to the cuvette 114. The rotator 116 includes a stepper motor with integrated position encoding, capable of maintaining rotation speeds between 0-3000 rpm with speed stability of ±0.1%. In some examples, the rotator 116 may incorporate a mounting interface that securely holds the cuvette 114 while minimizing mechanical stress on the optical surfaces. The rotation axis of the rotator 116 is precisely aligned with the central axis of the cuvette 114 to maintain uniform mixing dynamics throughout the dye solution volume. The control system of the rotator 116 enables programmed rotation profiles with acceleration and deceleration ramps optimized to prevent solution turbulence while enabling thorough mixing.

The active temperature control apparatus 118 is thermally coupled to the cuvette 114. The active temperature control apparatus 118 integrates both heating and cooling capabilities through a combination of resistive heating elements and thermoelectric cooling modules. A temperature sensing unit (not shown) may be incorporated, which utilizes platinum resistance temperature detector (RTD) sensors with 0.01° C. resolution, positioned at multiple points around the cuvette 114 for uniform temperature monitoring. Further, a thermal isolation system may be incorporated, which utilizes multi-layer insulation materials with thermal conductivity below 0.05 W/m·K to maintain precise temperature control. The active temperature control apparatus 118 maintains temperature stability of ±0.1° C. across an operating range of 20° C. to 180° C., with programmable heating and cooling rates of 2° C./min. The active temperature control apparatus 118 incorporates multiple heating zones with independent control, enabling thermal gradient management to optimize dye solution performance.

Further, as illustrated in FIG. 1, the system 100 includes a grating 120 positioned to receive the enriched laser light produced by the dye preparation unit 112. The grating 120 comprises a precision-ruled diffraction surface with 1200 lines/mm, optimized for operation across the 400-700 nm wavelength range. The grating 120 may be mounted on a high-precision rotation stage enabling angular positioning with 0.01-degree resolution for precise wavelength selection. The diffraction efficiency of the grating 120 exceeds 85% across the operational spectral range, with wavelength selection bandwidth of 0.1-5 nm. The grating 120 incorporates temperature stabilization mechanisms to maintain consistent diffraction characteristics during extended operation periods.

The system 100 further includes a dye solution pump 122 configured for precise fluid handling throughout therein. The dye solution pump 122 includes a high-precision peristaltic mechanism capable of maintaining flow rates between 0.1-10 mL/min with stability of ±1%. The dye solution pump 122 incorporates multiple fluid paths, including a sample line 124 directing fresh dye solution from a dye solution reservoir 126 to the cuvette 114, and a waste line 128 directing used solution to a waste container 130. Herein, the sample line 124 incorporates tubing with inner diameter of 1.6 mm and chemical resistance to both organic solvents and natural oils. Further, the waste container 130 incorporates overflow protection and chemical compatibility features suitable for extended operation periods. The dye solution reservoir 126 may also incorporate integrated temperature control maintaining solution stability at 20-0.5° C. prior to entry into the cuvette 114. In some examples, a fluid handling system (not shown) may be integrated with 0.2 µm filtration elements to maintain solution purity, and providing pressure monitoring at various points to lead to stable flow conditions.

In one or more embodiments, the system 100 includes additional optical components facilitating beam control and alignment. As illustrated in FIG. 1, the system 100 includes a second mirror setup 132 and a third mirror setup 134, which are positioned to direct the enriched laser light toward the grating 120. These mirror setups 132, 134 may include dielectric coatings optimized for the operational wavelength range, with reflectivity exceeding 99%. The system 100 may also include a slit 136 positioned in the optical path, leading to the grating 120, to control beam geometry and spectral characteristics. The system 100 further includes a washing system 138 connected to the fluid handling network for automated cleaning operations between experimental runs.

In the system 100, the laser light generated by the semiconductor diode laser source 102 undergoes sequential processing through multiple optical stages. Upon emission, the laser light first encounters the optical chopper 104, where the rotating disc modulates the beam at precisely controlled intervals. The modulated beam is then redirected by the first mirror setup 108 toward the cylindrical lens 110, which shapes the beam profile to match the geometry of the active region within the cuvette 114 of the dye preparation unit 112. Multiple processes occur simultaneously within the dye preparation unit 112 to maintain optimal conditions for laser light amplification. The rotator 116 maintains continuous movement of the dye solution at speeds between 100-1000 rpm, while the active temperature control apparatus 118 implements real-time temperature regulation with update rates of 100 Hz. The enriched laser light produced through dye excitation processes exhibits complex spectral characteristics requiring precise management. Herein, the second mirror setup 132 and the third mirror setup 134 maintain beam alignment with angular precision of 0.1 mrad. The slit 136, positioned between the third mirror setup 134 and the grating 120, provides spatial filtering with adjustable widths between 10-500 µm. Subsequently, the grating 120 achieves wavelength selection through angular positioning, with automated scanning capabilities across the full operational range of 400-700 nm.

Furthermore, in the system 100, the fluid management systems provide flow control protocols to maintain optimal dye solution characteristics. The dye solution pump 122 operates under closed-loop feedback control, utilizing flow sensors positioned along the sample line 124 and the waste line 128 to maintain precise volumetric flow rates. Flow velocities are maintained between 0.5-2.0 m/s to provide laminar flow conditions with Reynolds numbers below 2000. Further, the dye solution reservoir 126 maintains specific solution concentrations for different dye-solvent combinations, as required by the system 100 (discussed later in the description in detail). The washing system 138 executes automated cleaning protocols between experimental runs through a sequence of operations, including initial system purge with inert gas at 2 bar pressure, solvent rinse cycle using compatible cleaning agents, secondary purge cycle to remove residual cleaning agents, and system preparation cycle for the next experimental run. The washing system 138 integrates pressure monitoring at multiple points to enable proper cleaning agent distribution and complete system purging.

Figure 2:
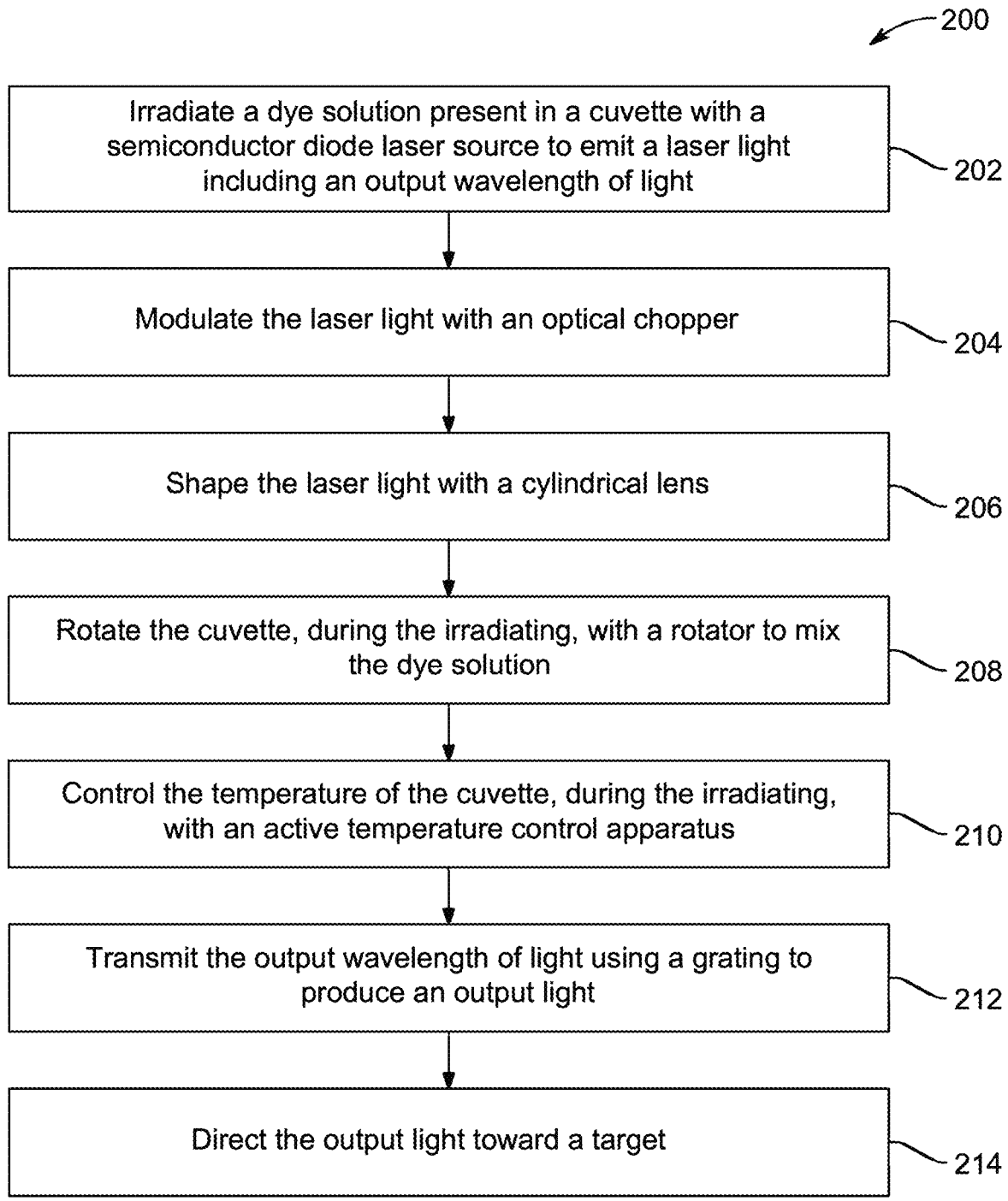
FIG. 2 is an exemplary flowchart of a method for producing light of a specified wavelength, according to certain embodiments.

Referring now to FIG. 2, the present disclosure further describes a method (as represented by reference numeral 200) for producing light of the specified wavelength. The implementation of the system 100, as per embodiments of the present disclosure, for producing the light of the specified wavelength has been discussed herein in consideration of the method 200. FIG. 2 provides a flowchart listing various steps involved in the method 200. As illustrated, the method 200 includes a series of steps which may follow a sequential order. These steps are only illustrative, and other alternatives may be considered where one or more steps are added, one or more steps are removed, or one or more steps are provided in a different sequence without departing from the scope of the present disclosure. Various variants disclosed with respect to the aforementioned system 100 apply *Mutatis mutandis* to the present method 200 for producing light of the specified wavelength.

At step 202, the method 200 includes irradiating a dye solution present in the cuvette 114 with the semiconductor diode laser source 102 to emit laser light including an output wavelength of light. The semiconductor diode laser source 102 generates high-power laser radiation with precisely controlled pulse characteristics, maintaining 6 mJ pulse energy at 10 Hz repetition rate with power stability of ±1%. The laser beam path incorporates the first mirror setup 108 to direct the radiation through an optimized trajectory, enabling maximum energy transfer efficiency to the dye solution contained within the cuvette 114. The irradiation process maintains consistent beam characteristics through integrated thermal management and power stabilization systems within the semiconductor diode laser source 102, enabling sustained operation without degradation in output parameters.

At step 204, the method 200 includes modulating the laser light with the optical chopper 104. The modulation mechanism employs the rotating disc with systematically spaced apertures, driven by the controlled motor mechanism 106. The controlled motor mechanism 106 maintains rotational speed stability of ±0.1% across the operational range of 1-100 Hz, implementing closed-loop feedback control with position encoding resolution of 0.1 degrees. The modulation process generates precisely timed light pulses with greater than 98% contrast ratio between transmission and blocking states, while maintaining beam spatial coherence characteristics. The optical chopper 104 system incorporates phase-locked synchronization with the semiconductor diode laser source 102, achieving temporal coordination with less than 100 nanoseconds of timing jitter between pulse generation and modulation events.

At step 206, the method 200 includes shaping the laser light with the cylindrical lens 110. The cylindrical lens 110 implements beam profile modification, transforming the incident circular beam into a line configuration optimized for uniform dye excitation. The shaping process maintains focal characteristics with aberration control below $\lambda/10$ across the operational wavelength range of 350-800 nm. The cylindrical lens 110 generates a focused line with precisely controlled dimensions of 0.2 mm×4 mm, creating an energy density distribution optimized for uniform excitation across the active volume of the dye solution. The mounting system maintains positional stability with thermal drift below 1 µm/° C., enabling consistent beam geometry throughout extended operation periods.

At step 208, the method 200 includes rotating the cuvette 114, during the irradiating, with the rotator 116 to mix the dye solution. The rotation process implements velocity control between 0-3000 rpm with speed stability of ±0.1%, utilizing closed-loop feedback from integrated position encoders. The rotator 116 executes precision acceleration and deceleration profiles to prevent solution turbulence while leading to thorough mixing throughout the active volume. The mechanical coupling between the rotator 116 and the cuvette 114 maintains axial alignment within 10 µm, minimizing mechanical stress on the optical surfaces while enabling uniform solution dynamics. The rotation axis maintains perpendicularity to the incident laser beam path within 0.1 degrees, optimizing interaction between the shaped laser light and the dye solution volume.

At step 210, the method 200 includes controlling the temperature of the cuvette 114, during the irradiating, with the active temperature control apparatus 118. The temperature control process implements dual-mode operation utilizing both heating and cooling capabilities through integrated resistive heating elements and thermoelectric cooling modules. The active temperature control apparatus 118 maintains temperature stability of ±0.1° C. across the operational range of 20° C. to 180° C. through multiple platinum RTD sensors with 0.01° C. resolution. The active temperature control apparatus 118 executes temperature adjustments with precisely controlled ramp rates of 2° C./min to prevent thermal shock while maintaining optimal dye solution performance. The multi-zone heating configuration enables strategic thermal gradient management through independent control of distinct regions around the cuvette 114, with thermal isolation maintaining less than 0.05 W/m. K heat transfer to surrounding components.

At step 212, the method 200 includes transmitting the output wavelength of light using the grating 120 to produce an output light. The transmission process utilizes the precision-ruled diffraction surface with 1200 lines/mm to achieve wavelength selection with 0.1-5 nm bandwidth resolution. The grating 120 maintains angular positioning through a high-precision rotation stage with 0.01-degree resolution, enabling precise selection of output wavelengths across the 400-700 nm operational range. The diffraction efficiency exceeds 85% for the selected wavelength bands, with wavefront distortion maintained below λ/4 across the active area. The said temperature-stabilized mounting system maintains diffraction characteristics with thermal drift below 0.001 degrees/° C., leading to consistent wavelength selection during extended operation periods.

At step 214, the method 200 includes directing the output light toward a target. The output light is directed through an optical path utilizing the second mirror setup 132 and the third mirror setup 134. The direction process maintains beam pointing stability within ±0.1 mrad through thermally compensated mounting systems. The second mirror setup 132 and the third mirror setup 134 incorporate dielectric coatings optimized for the operational wavelength range of 400-700 nm, achieving reflectivity exceeding 99% while maintaining wavefront distortion below λ/10. The slit 136, positioned between the third mirror setup 134 and the target, provides additional spatial filtering with adjustable widths from 10-500 µm, enabling fine control of the output beam characteristics. The complete beam path maintains atmospheric isolation through sealed enclosures with controlled humidity below 30% RH.

In embodiments of the present disclosure, the method 200 utilizes specific dye solutions comprising natural oils as solvents combined with precisely controlled concentrations of active dye compounds. Specifically, the dye solution comprises the natural oil selected from the group consisting of moringa, avocado, almond, castor, pumpkin, lemon, and combinations thereof, in a major amount, and a dye. Herein, the natural oil component constitutes 95-99.9% by weight of the solution. Further, the dye compounds are incorporated at concentrations between 1-3 µg/mL, optimized for maximum emission efficiency while maintaining solution stability. The dye-oil combinations demonstrate amplified spontaneous emission characteristics with wavelength-specific peaks determined by the selected dye compound and natural oil composition.

In the present implementation, each natural oil demonstrates distinct optical and thermal characteristics advantageous for laser operations. The natural oil solvents enable operation at elevated temperatures up to 180° C. while maintaining photochemical stability for greater than 4000 pulses. For instance, lemon oil exhibits optimal transmission characteristics for DMP with absorption peaks at 360 nm and 392 nm; castor oil provides desirablesolvation properties for Rhodamine B with a primary absorption at 560 nm; moringa oil, avocado oil, almond oil, and pumpkin oil demonstrate specific refractive index characteristics optimized for efficient light transmission. These details are discussed later in the description along with test results and experimental data for reference.

Figure 3A:
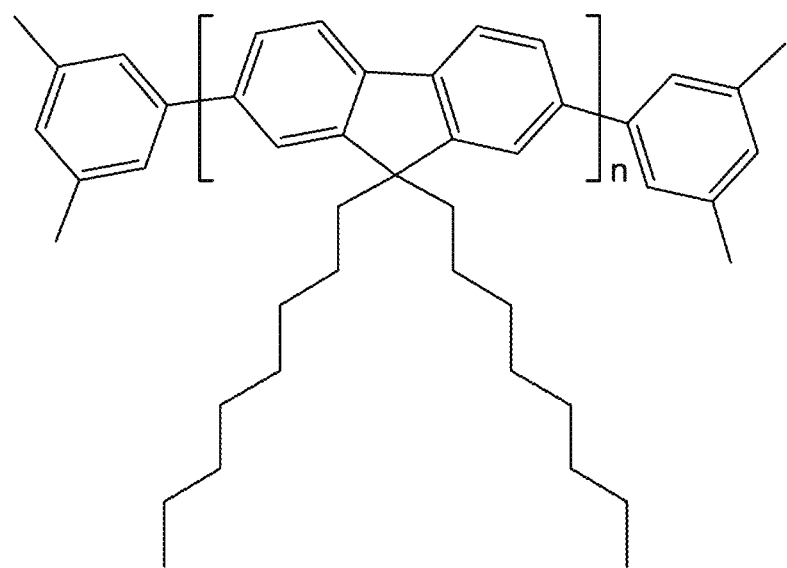
FIG. 3A is an exemplary depiction of a molecular structure of poly(9,9-didodecylfluorenyl-2,7-diyl)-end-capped with dimethylphenyl (DMP), according to certain embodiments.
Figure 3B:
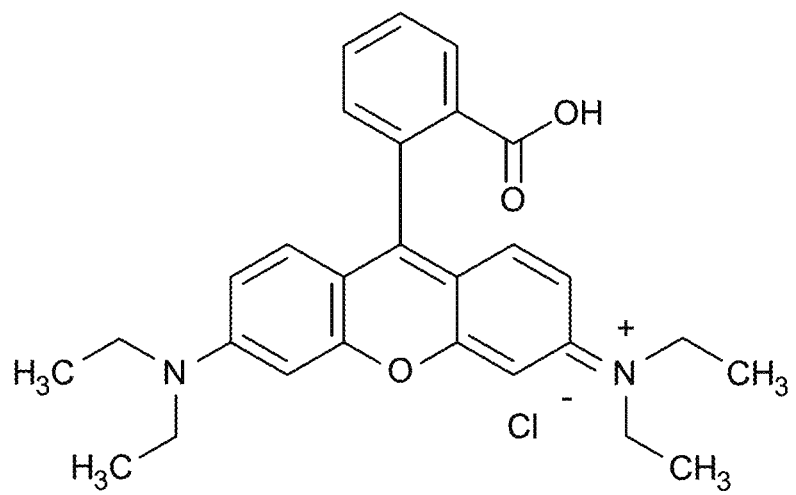
FIG. 3B is an exemplary depiction of a molecular structure of Rhodamine B (Rh-B), according to certain embodiments.

According to an embodiment of the present disclosure, the oil is lemon oil and the dye is poly(9,9-didodecylfluorenyl-2,7-diyl)-end-capped with dimethylphenyl. FIGS. 3A and 3B illustrate molecular structures of dye compounds utilized in the system 100 and the method 200 of the present disclosure. Specifically, FIG. 3A depicts the molecular architecture of poly(9,9-didodecylfluorenyl-2,7-diyl)-end-capped with dimethylphenyl (DMP), comprising a conjugated fluorene-based backbone with systematically positioned didodecyl side chains at the 9-position. The structure features terminal dimethylphenyl groups that facilitate enhanced solubility and molecular dispersion within the lemon oil medium. The conjugated backbone structure enables efficient π-electron delocalization, contributing to the optical properties desirable in laser applications. Further, FIG. 3B depicts the molecular structure of Rhodamine B (Rh-B), illustrating its characteristic xanthene core with symmetrically positioned diethylamino groups and a carboxyl-functionalized phenyl ring substituent. The molecular geometry of Rh-B is optimized for interaction with polar solvent environments, explaining its selective solubility characteristics in specific natural oils.

Figure 4:
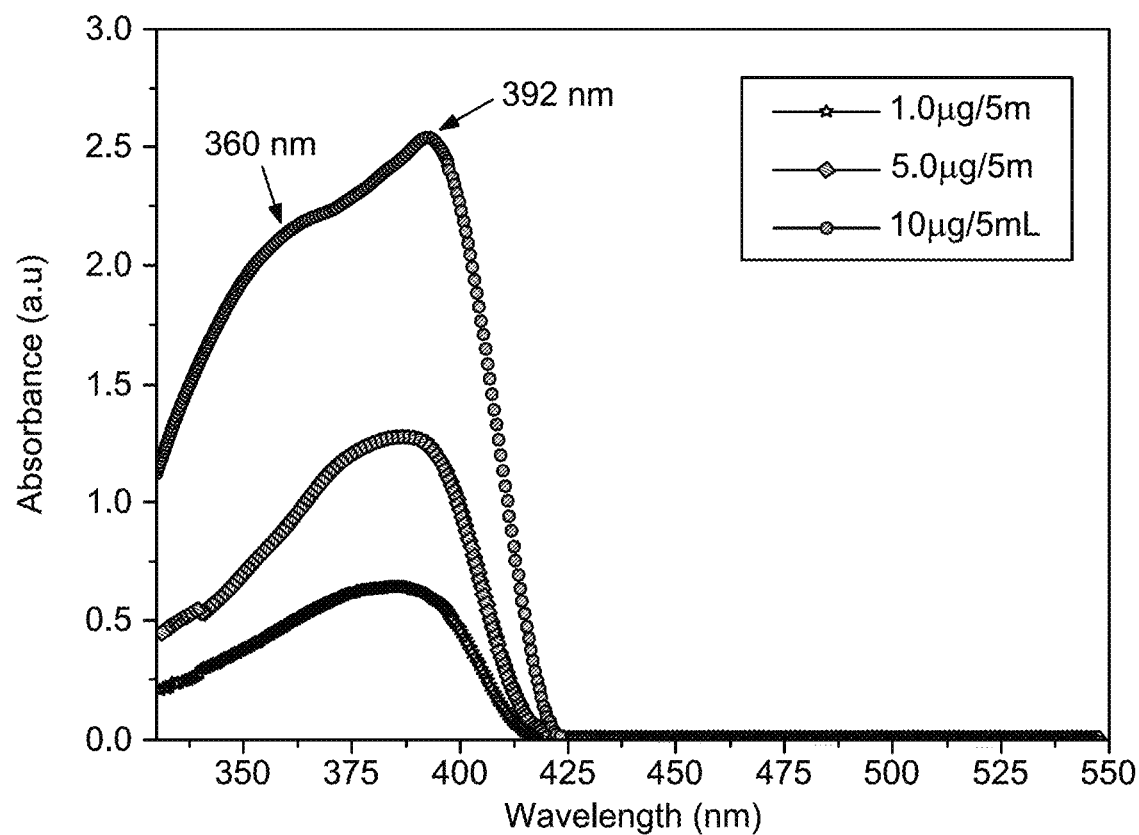
FIG. 4 is an exemplary graph of absorption spectrum of DMP in lemon oil at room temperature for different concentrations, according to certain embodiments.

In an embodiment, the concentration of poly(9,9-didodecylfluorenyl-2,7-diyl)-end-capped with dimethylphenyl in the lemon oil is in a range from 1 to 3 µg/mL. FIG. 4 presents absorption characteristics of DMP in lemon oil at room temperature. The absorption spectra show two distinct peaks at 360 nm and 392 nm across concentrations from 1.0 µg/5 mL to 10.0 µg/5 mL. Increasing concentration reveals no additional peaks at higher wavelengths, confirming the absence of dimer phase formation in the lemon oil solutions.

Figure 5A:
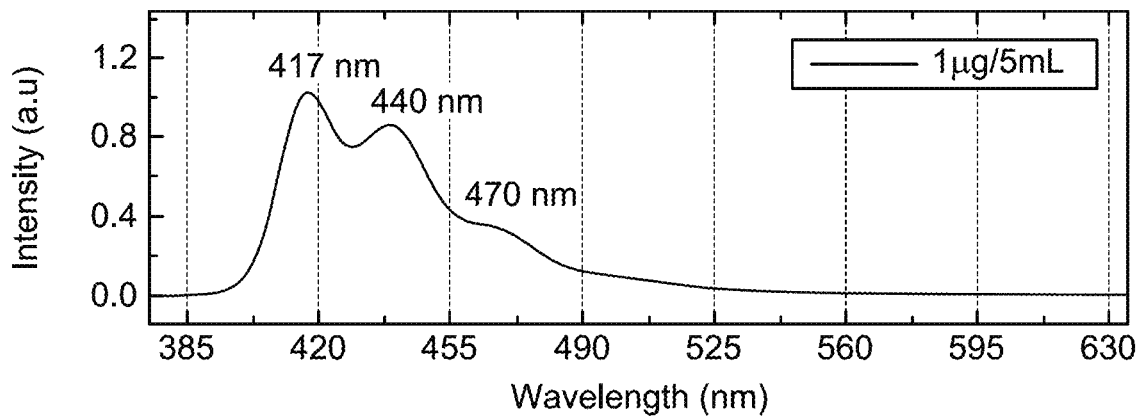
FIG. 5A is an exemplary graph of emission spectrum of DMP in lemon oil at room temperature for concentration of 1 µg/5 mL, according to certain embodiments.
Figure 5B:
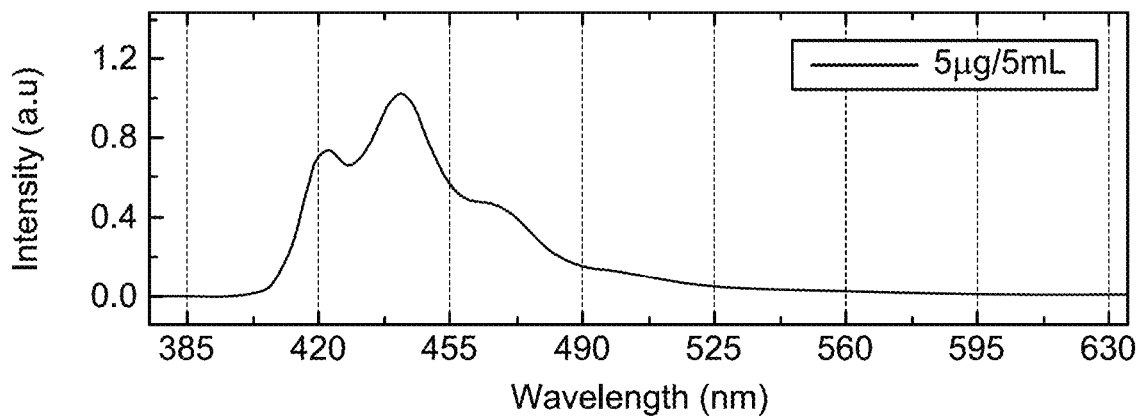
FIG. 5B is an exemplary graph of emission spectrum of DMP in lemon oil at room temperature for concentration of 5 µg/5 mL, according to certain embodiments.
Figure 5C:
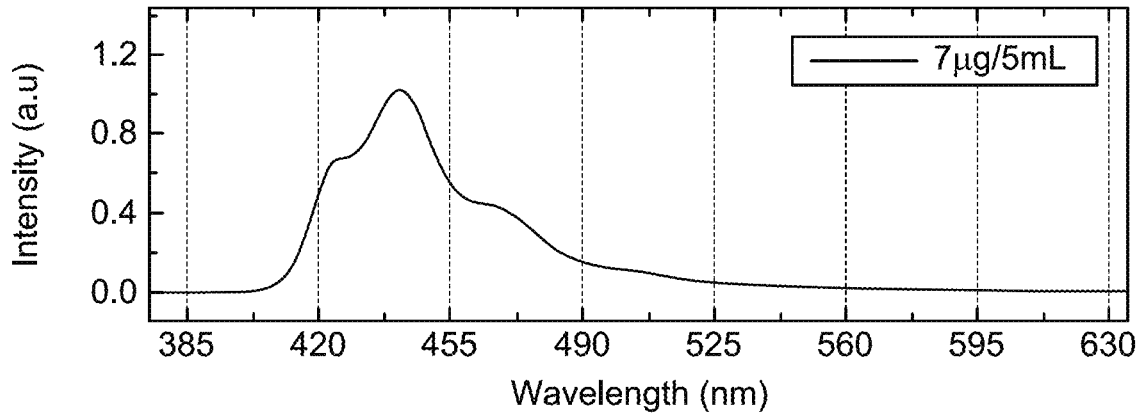
FIG. 5C is an exemplary graph of emission spectrum of DMP in lemon oil at room temperature for concentration of 7 µg/5 mL, according to certain embodiments.
Figure 5D:
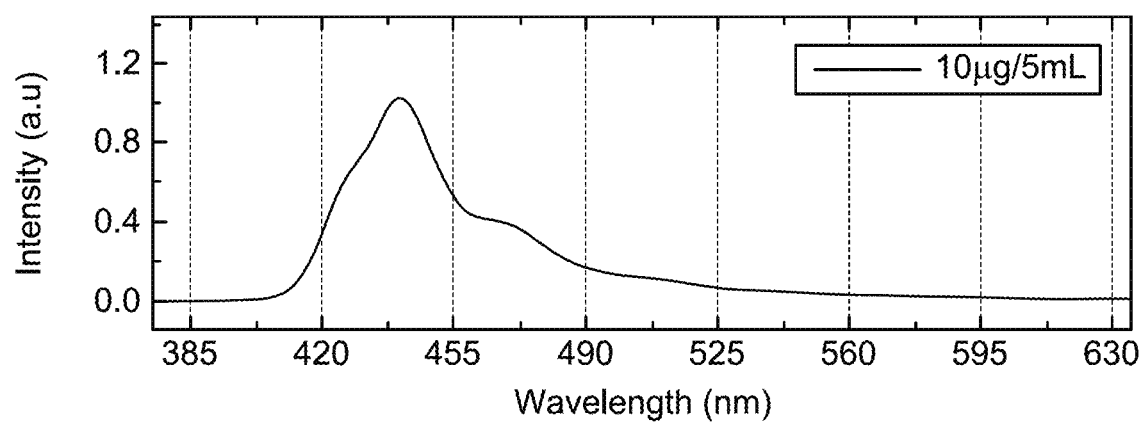
FIG. 5D is an exemplary graph of emission spectrum of DMP in lemon oil at room temperature for concentration of 10 µg/5 mL, according to certain embodiments.

FIGS. 5A-5D present emission spectra of DMP in lemon oil at room temperature for concentrations of 1.0, 5.0, 7.0, and 10.0 µg/5 mL respectively. As illustrated in FIG. 5A, at 1.0 µg/5 mL, the spectrum exhibits three characteristic peaks at 417 nm, 440 nm, and 470 nm. Through FIGS. 5B-5D, increasing concentration causes the 417 nm peak, initially dominant at lower concentrations, to decrease in intensity while the shoulder peak at 440 nm becomes prominent at higher concentrations (10 μg/5 mL). The spectral evolution indicates formation of excimer or exciplex states at elevated concentrations within the lemon oil medium.

Figure 6:
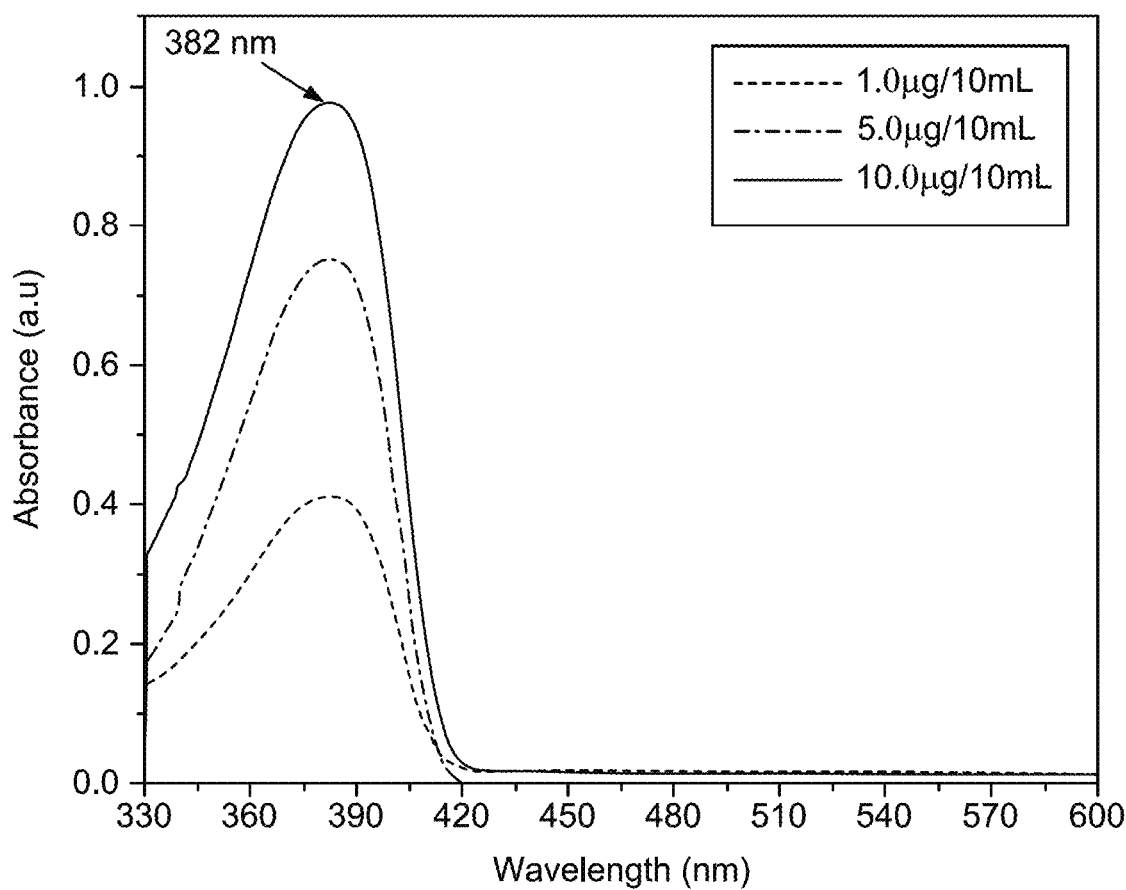
FIG. 6 is an exemplary graph of absorption spectrum of DMP in benzene at room temperature for different concentrations, according to certain embodiments.

FIG. 6 presents absorption characteristics of DMP in benzene at room temperature for different concentrations. The absorption spectrum exhibits a single characteristic peak at 382 nm across the concentration range of 1.0 μg/10 mL to 10.0 μg/10 mL. The consistent single absorption peak indicates stable and homogeneous polymer structure in benzene, demonstrating concentration-independent absorption behavior within this specific wavelength range.

Figure 7A:
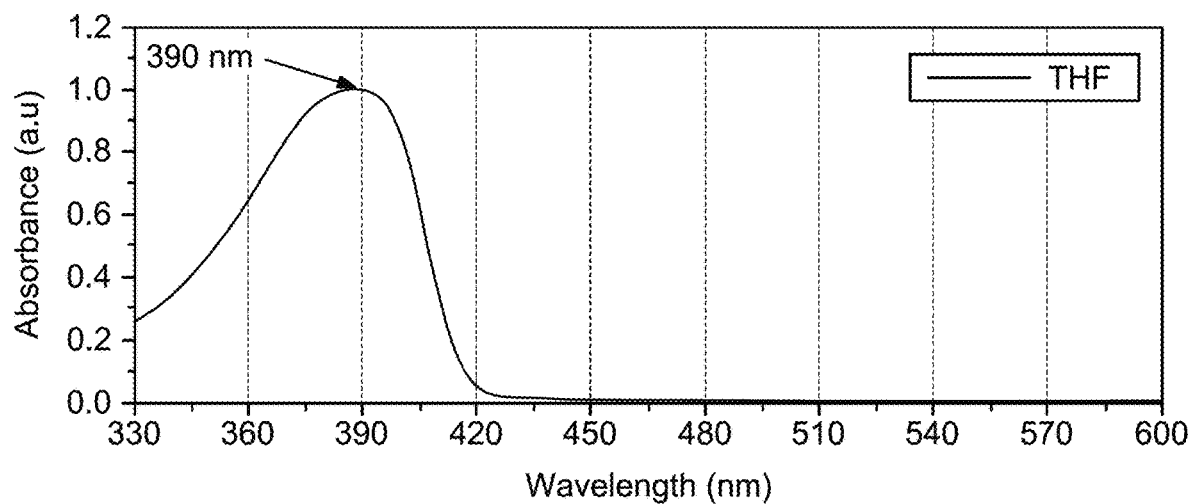
FIG. 7A is an exemplary graph of absorption spectrum of DMP in tetrahydrofuran (THF) at room temperature for a concentration of 10 µg/mL, according to certain embodiments.
Figure 7B:
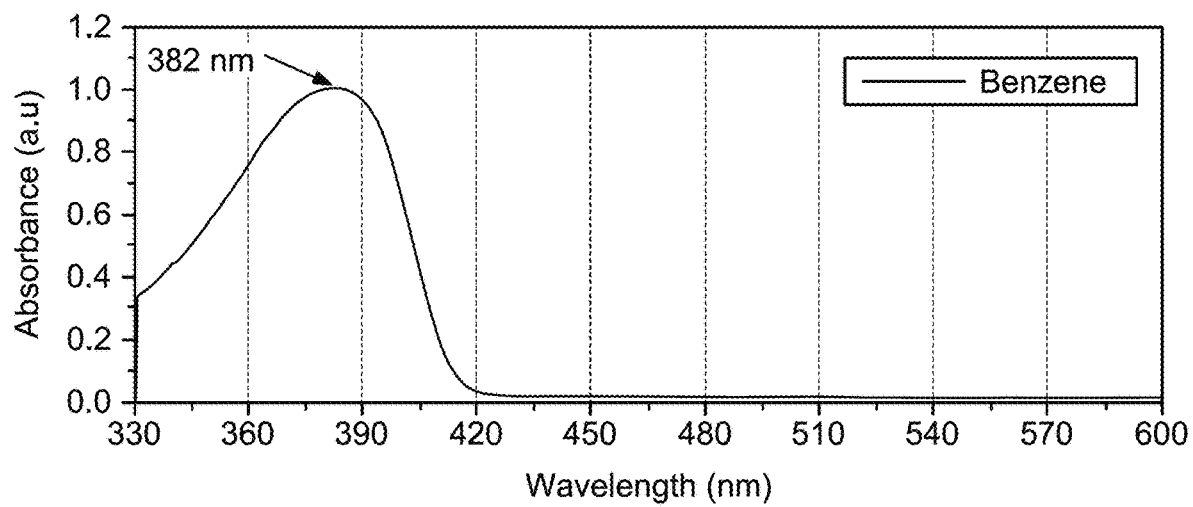
FIG. 7B is an exemplary graph of absorption spectrum of DMP in benzene at room temperature for a concentration of 10 µg/mL, according to certain embodiments.

FIGS. 7A and 7B present comparative absorption spectra of DMP in THF and benzene, respectively, at room temperature with a fixed concentration of 10 μg/mL. FIG. 7A shows DMP in THE exhibiting an absorption peak at 390 nm, while FIG. 7B shows DMP in benzene with a peak at 382 nm. The shift in peak position between the two solvents is attributed to solvent polarity effects on the electronic environment of the polymer structure.

Figure 8A:
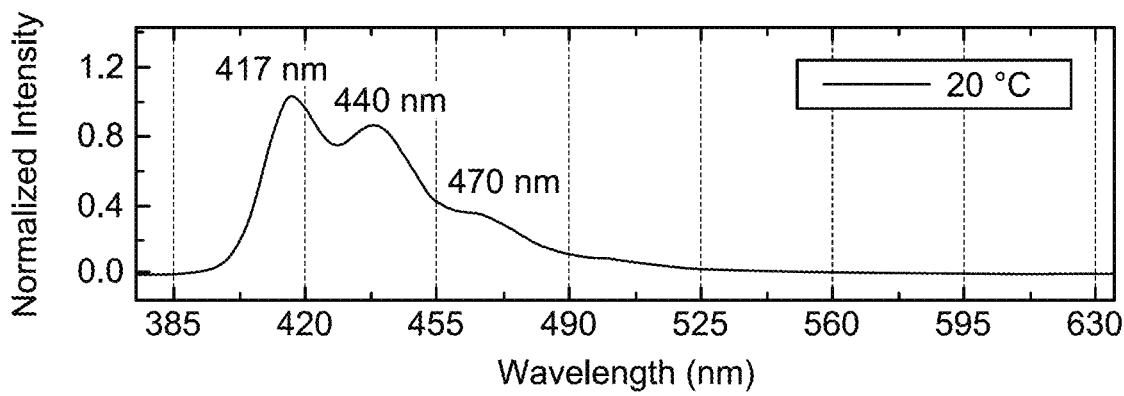
FIG. 8A is an exemplary graph of emission spectrum of DMP in lemon oil at a temperature of 20° C. for a concentration of 10 µg/5 mL, according to certain embodiments.
Figure 8B:
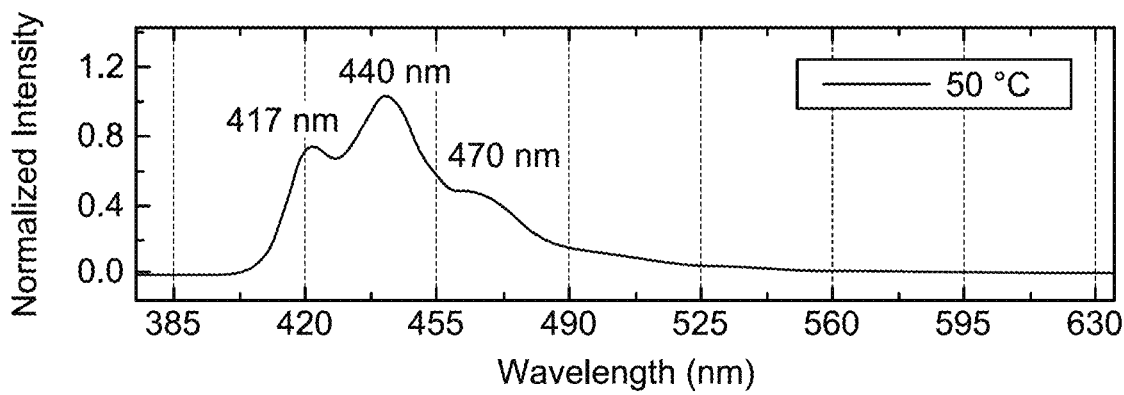
FIG. 8B is an exemplary graph of emission spectrum of DMP in lemon oil at a temperature of 50° C. for a concentration of 10 µg/5 mL, according to certain embodiments.
Figure 8C:
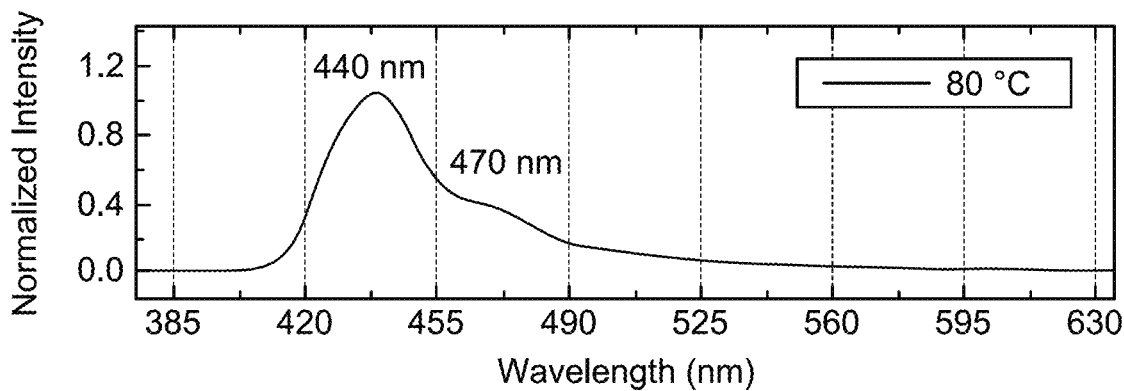
FIG. 8C is an exemplary graph of emission spectrum of DMP in lemon oil at a temperature of 80° C. for a concentration of 10 µg/5 mL, according to certain embodiments.
Figure 8D:
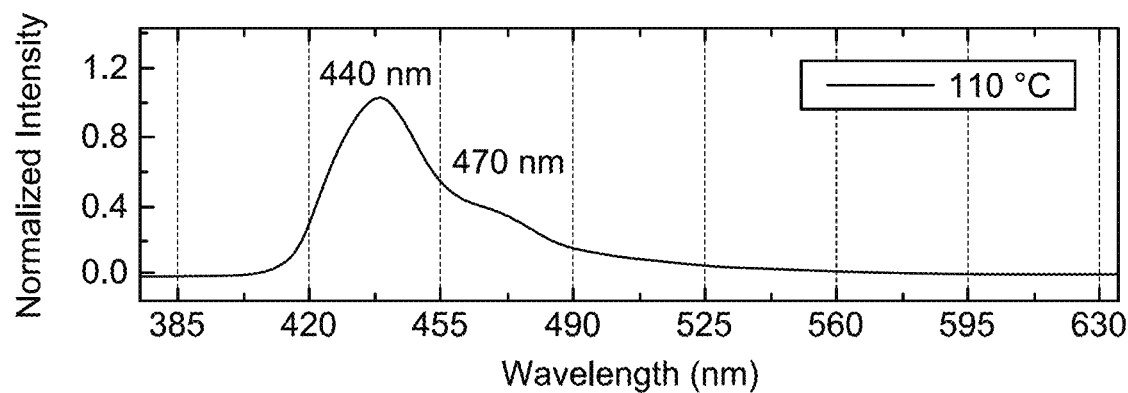
FIG. 8D is an exemplary graph of emission spectrum of DMP in lemon oil at a temperature of 110° C. for a concentration of 10 µg/5 mL, according to certain embodiments.
Figure 8E:
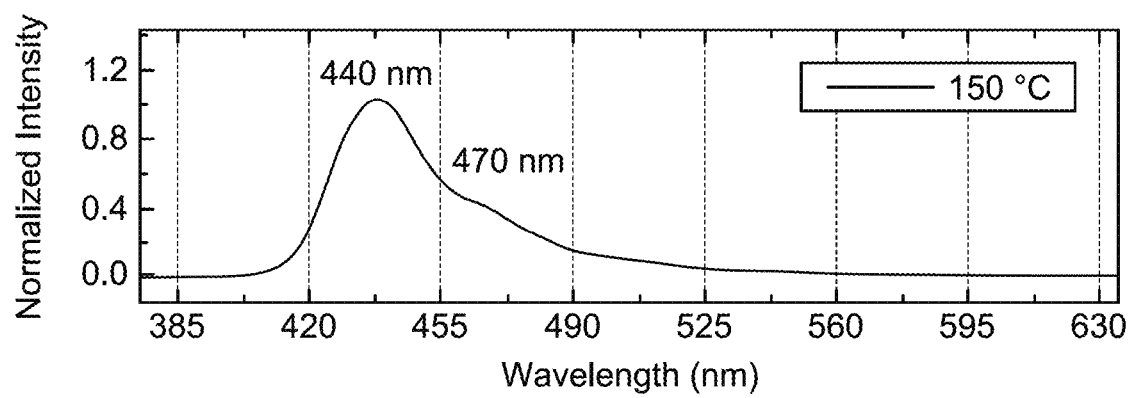
FIG. 8E is an exemplary graph of emission spectrum of DMP in lemon oil at a temperature of 150° C. for a concentration of 10 µg/5 mL, according to certain embodiments.

FIGS. 8A-8E present the temperature-dependent emission spectra of DMP in lemon oil at a fixed concentration of 10 μg/5 mL. FIG. 8A shows emission characteristics at 20° C., showing three distinct peaks at 417 nm, 440 nm, and 470 nm. FIG. 8B shows spectral evolution at 50° C. FIG. 8C shows the emission profile at 80° C. with the ASE intensity greater than or equal to 105% of the ASE intensity at 20° C. FIG. 8D shows emission characteristics at 110° C. with enhanced 440 nm peak prominence. FIG. 8E shows emission behavior at 150° C., where the 440 nm and 470 nm peaks achieve maximum intensity with minimal contribution from the 417 nm peak.

Figure 9:
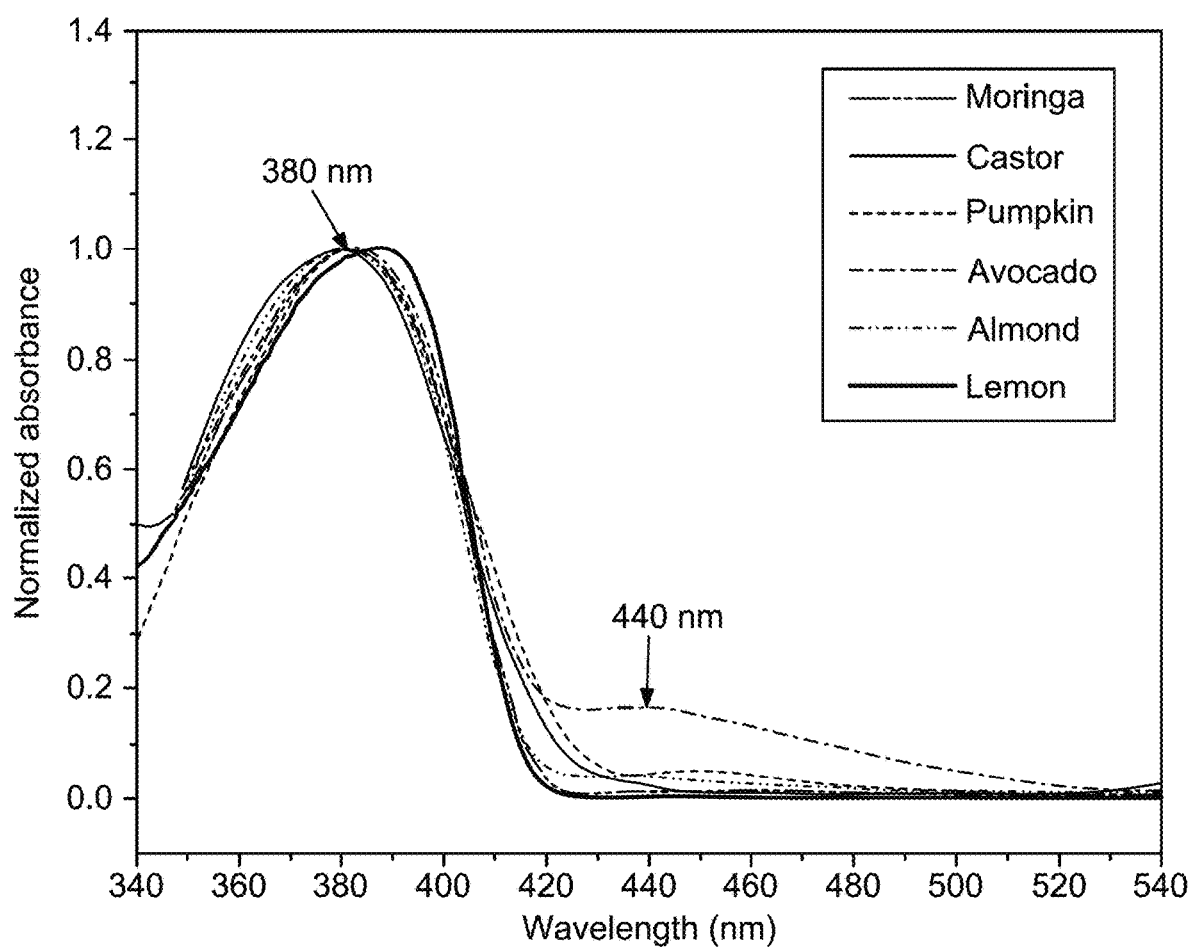
FIG. 9 is an exemplary graph of absorption spectrum of DMP in different natural oils at room temperature for a concentration of 10 µg/5 mL, according to certain embodiments.

FIG. 9 presents absorption characteristics of DMP in different natural oils at room temperature with a uniform concentration of 10 μg/5 mL. The absorption spectra reveal two distinct bands at 380 nm for all oils, with an additional small absorption feature around 440 nm observed in all oils except lemon oil. This secondary feature indicates potential aggregate formation in these solutions. The absorption data demonstrates uniform molecular dispersion in lemon oil, while other natural oils exhibit varying degrees of molecular association effects manifested through the 440 nm absorption band.

Figure 10A:
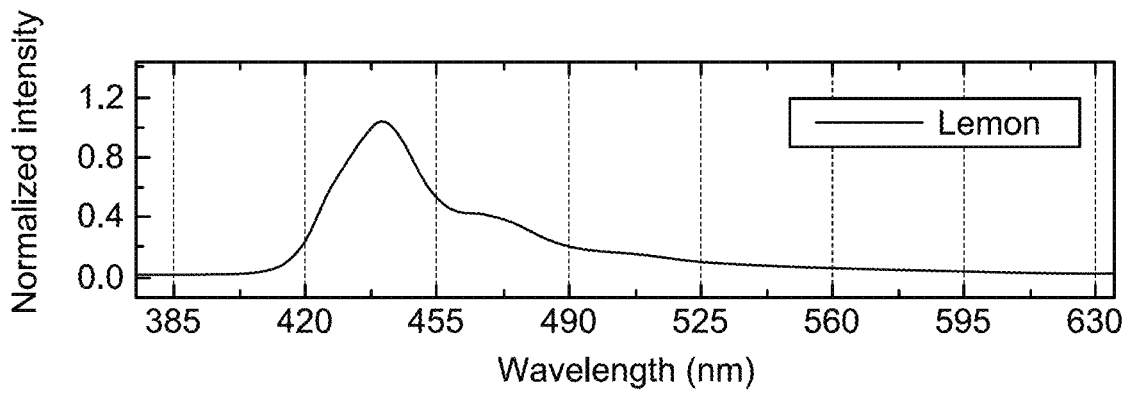
FIG. 10A is an exemplary graph of emission spectrum of DMP in lemon oil at room temperature for a concentration of 10 µg/5 mL, according to certain embodiments.
Figure 10B:
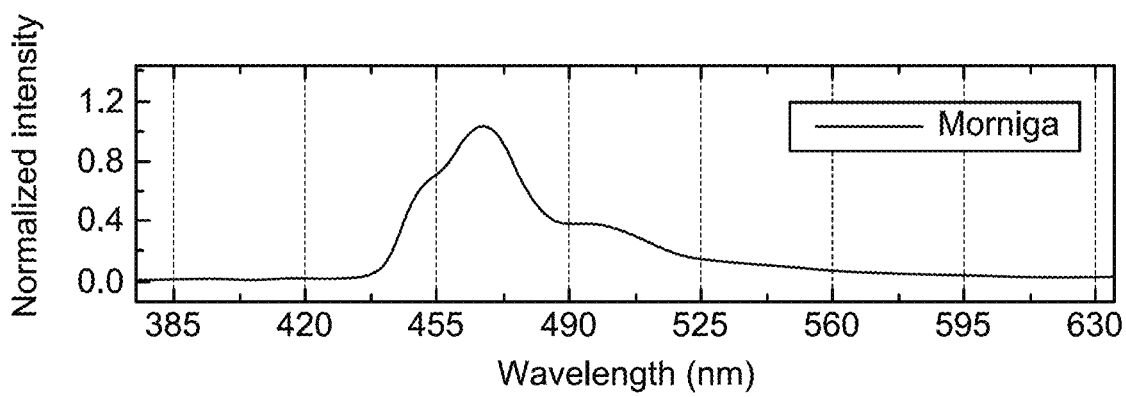
FIG. 10B is an exemplary graph of emission spectrum of DMP in moringa oil at room temperature for a concentration of 10 µg/5 mL, according to certain embodiments.
Figure 10C:
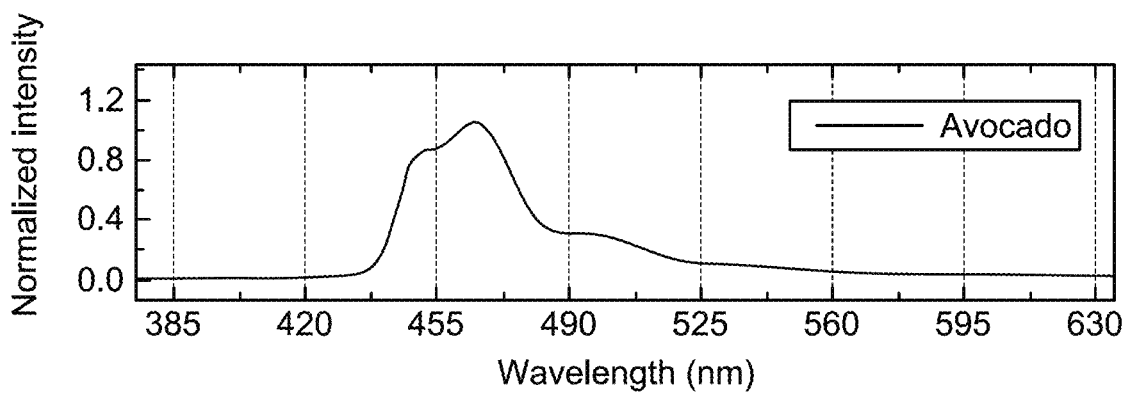
FIG. 10C is an exemplary graph of emission spectrum of DMP in avocado oil at room temperature for a concentration of 10 µg/5 mL, according to certain embodiments.
Figure 10D:
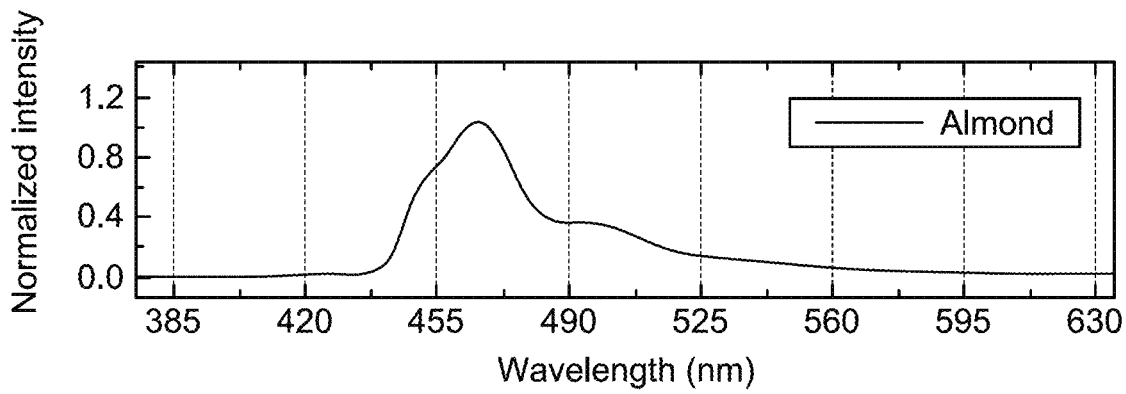
FIG. 10D is an exemplary graph of emission spectrum of DMP in almond oil at room temperature for a concentration of 10 µg/5 mL, according to certain embodiments.
Figure 10E:
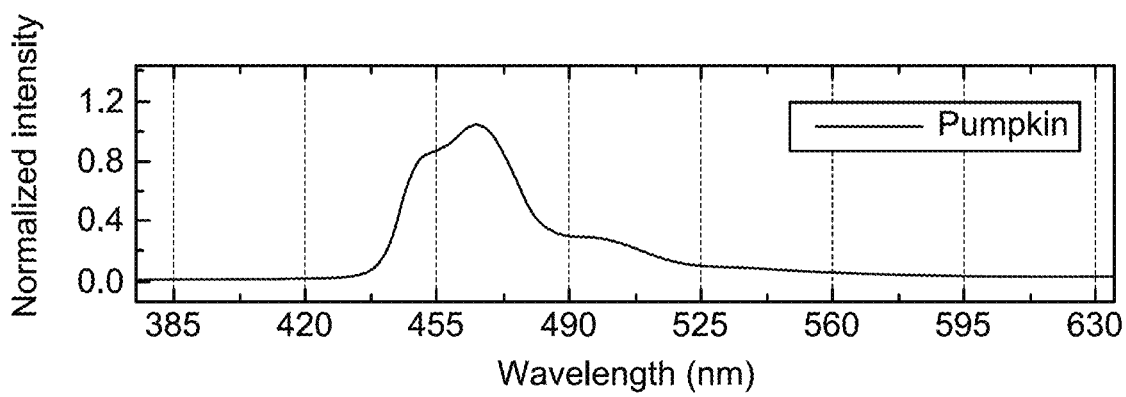
FIG. 10E is an exemplary graph of emission spectrum of DMP in pumpkin oil at room temperature for a concentration of 10 µg/5 mL, according to certain embodiments.
Figure 10F:
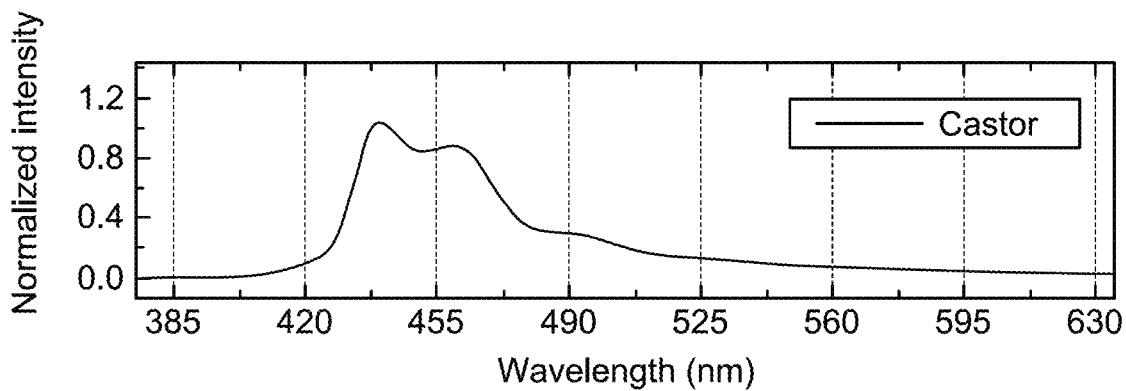
FIG. 10F is an exemplary graph of emission spectrum of DMP in castor oil at room temperature for a concentration of 10 µg/5 mL, according to certain embodiments.

FIGS. 10A-10F present emission spectra of DMP in various natural oils at room temperature with a concentration of 10 μg/5 mL. FIG. 10A shows emission characteristics in lemon oil with well-defined spectral features. FIG. 10B shows emission in moringa oil with distinct peak distributions. FIG. 10C shows emission behavior in avocado oil, while FIGS. 10D and 10E show emission profiles in almond and pumpkin oils respectively. FIG. 10F shows emission characteristics in castor oil. Each oil system exhibits unique emission peak positions and intensities. This variability can be attributed to the specific properties of each oil, such as its polarity, viscosity, and chemical composition, which influence the solvation environment of the dissolved DMP. The dipole-dipole interactions between DMP and the different oils can affect the electronic states of the molecules, thereby altering the energy levels and, consequently, the spectral characteristics. This highlights the importance of selecting an appropriate solvent for optimizing the optical properties of DMP in laser applications.

Figure 11A:
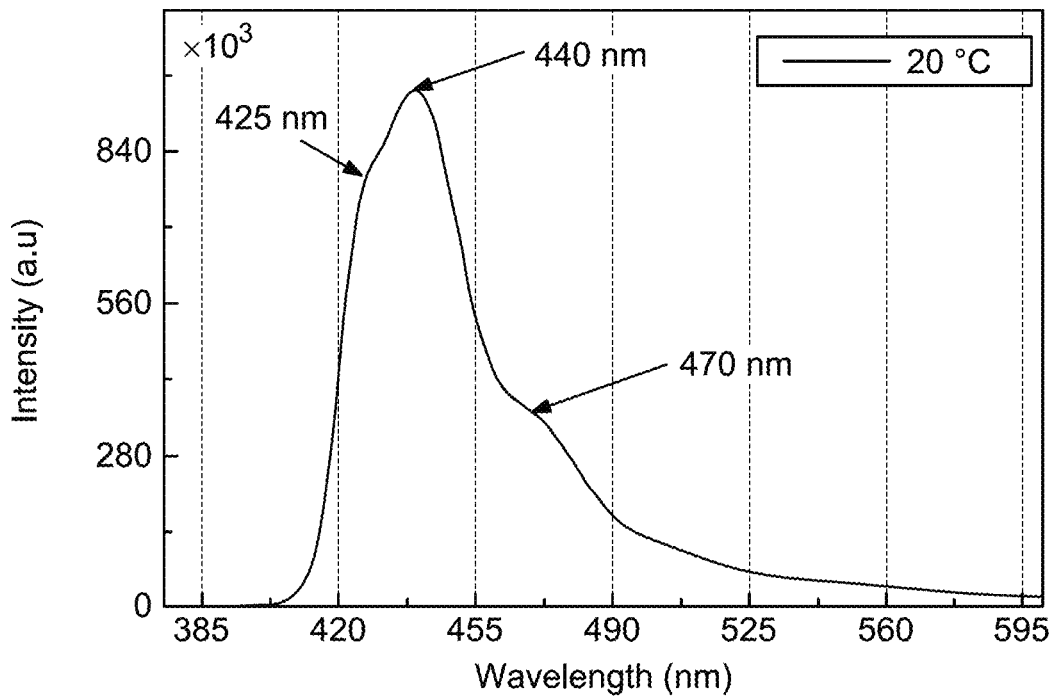
FIG. 11A is an exemplary graph of emission spectrum of DMP in benzene at 20° C. for a concentration of 10 µg/5 mL, according to certain embodiments.
Figure 11B:
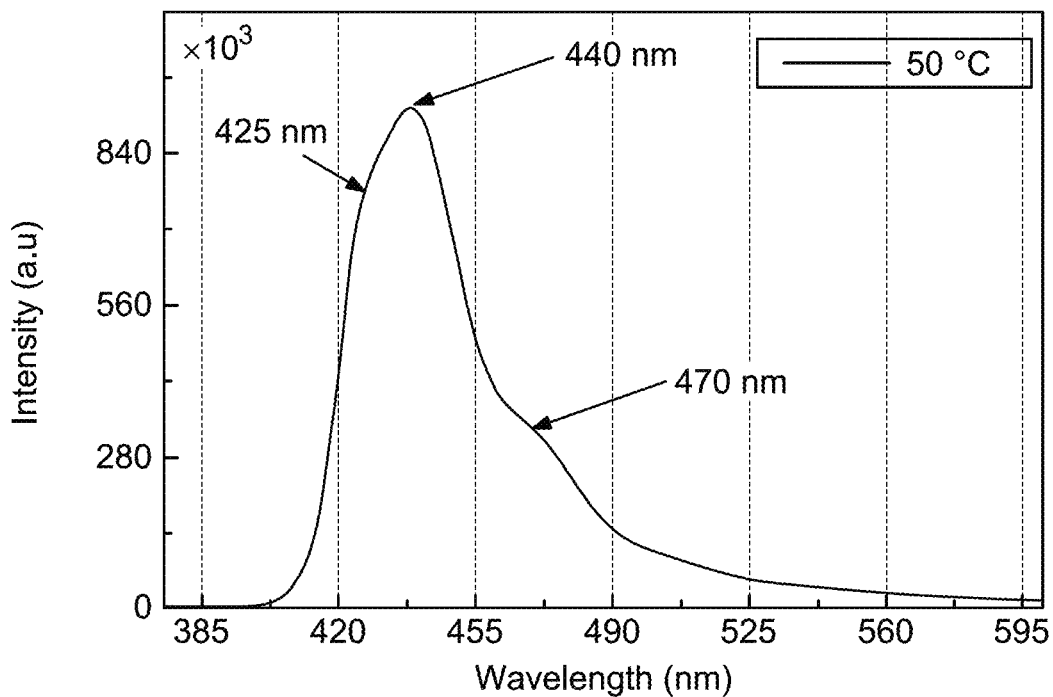
FIG. 11B is an exemplary graph of emission spectrum of DMP in benzene at 50° C. for a concentration of 10 µg/5 mL, according to certain embodiments.
Figure 12A:
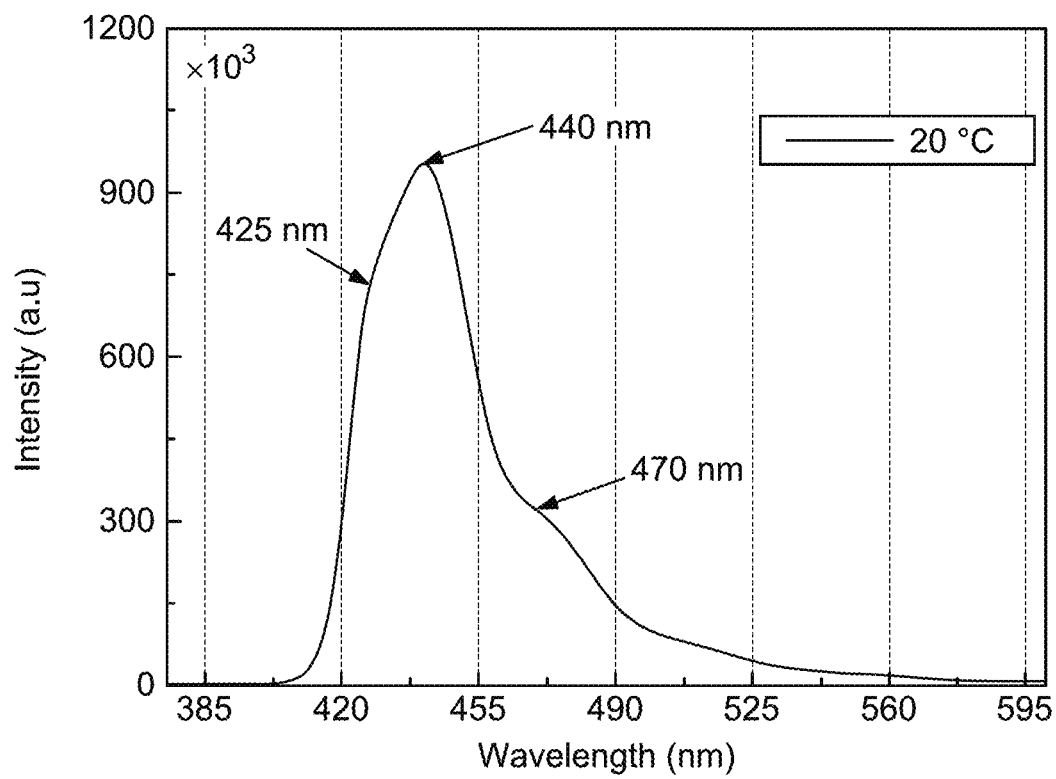
FIG. 12A is an exemplary graph of emission spectrum of DMP in THF at 20° C. for a concentration of 10 µg/5 mL, according to certain embodiments.
Figure 12B:
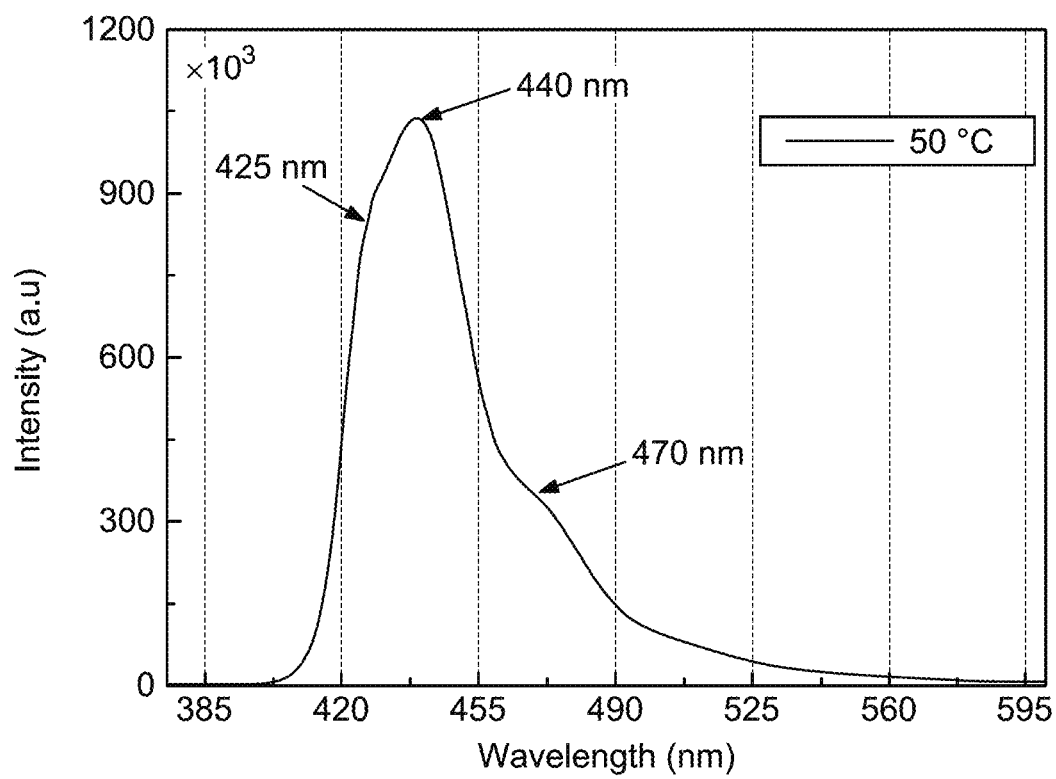
FIG. 12B is an exemplary graph of emission spectrum of DMP in THF at 50° C. for a concentration of 10 µg/5 mL, according to certain embodiments.

FIGS. 11A and 11B present emission spectra of DMP in benzene at a concentration of 10 μg/5 mL. FIG. 11A shows emission characteristics at 20° C. with peaks at 425 nm, 440 nm, and 470 nm. FIG. 11B shows the emission profile at 50° C. with minimal spectral evolution, constrained by the thermal limitations of the conventional solvent. FIGS. 12A and 12B show analogous data for DMP in THF under identical concentration and temperature conditions, exhibiting similar thermal insensitivity in peak positions and relative intensities.

Figure 13B:
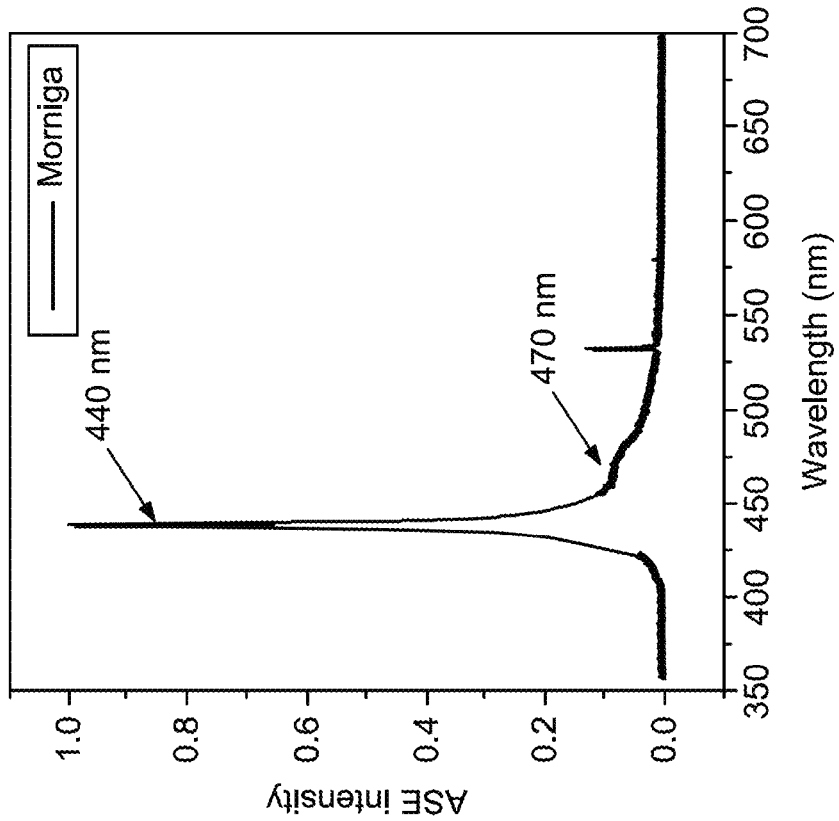
FIG. 13B is an exemplary graph of ASE spectrum of DMP in moringa oil at room temperature for a concentration of 10 µg/5 mL, according to certain embodiments.
Figure 13A:
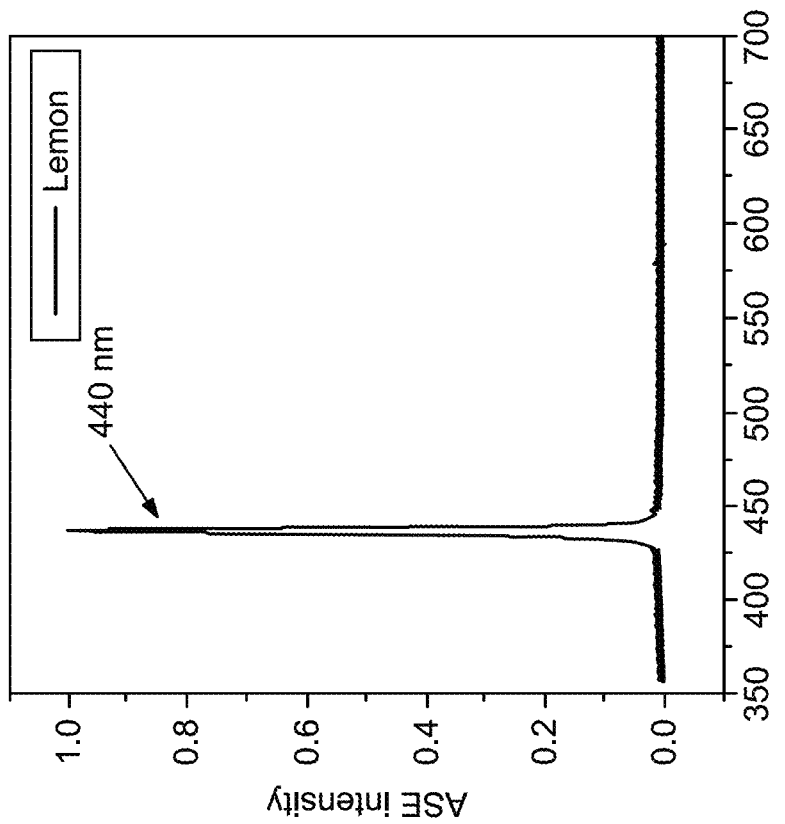
FIG. 13A is an exemplary graph of amplified spontaneous emission (ASE) spectrum of DMP in lemon oil at room temperature for a concentration of 10 µg/5 mL, according to certain embodiments.
Figure 13D:
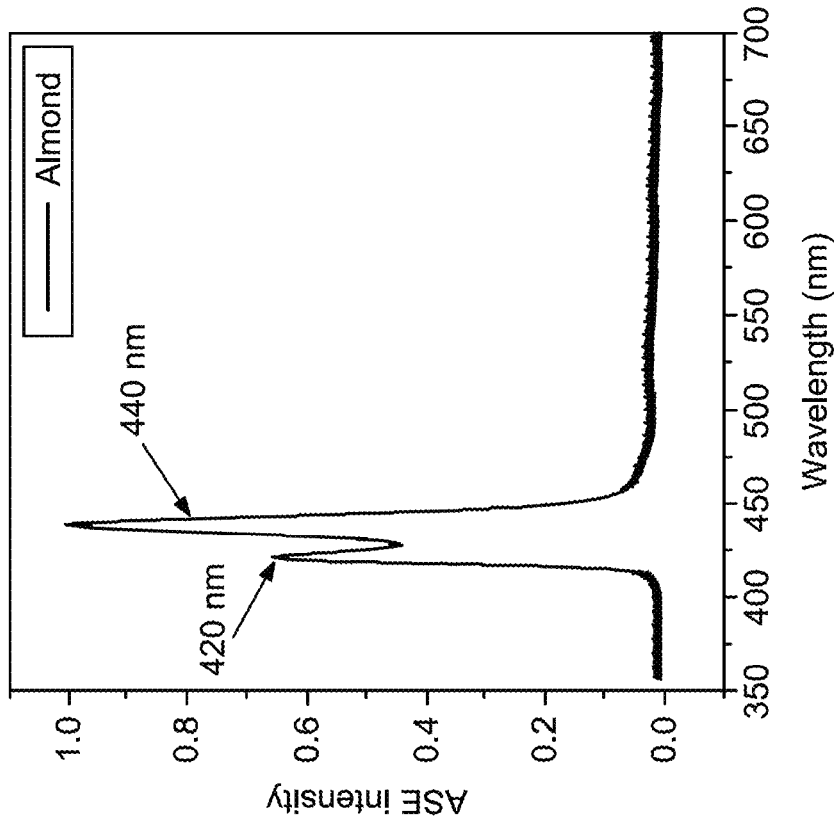
FIG. 13D is an exemplary graph of ASE spectrum of DMP in almond oil at room temperature for a concentration of 10 µg/5 mL, according to certain embodiments.
Figure 13C:
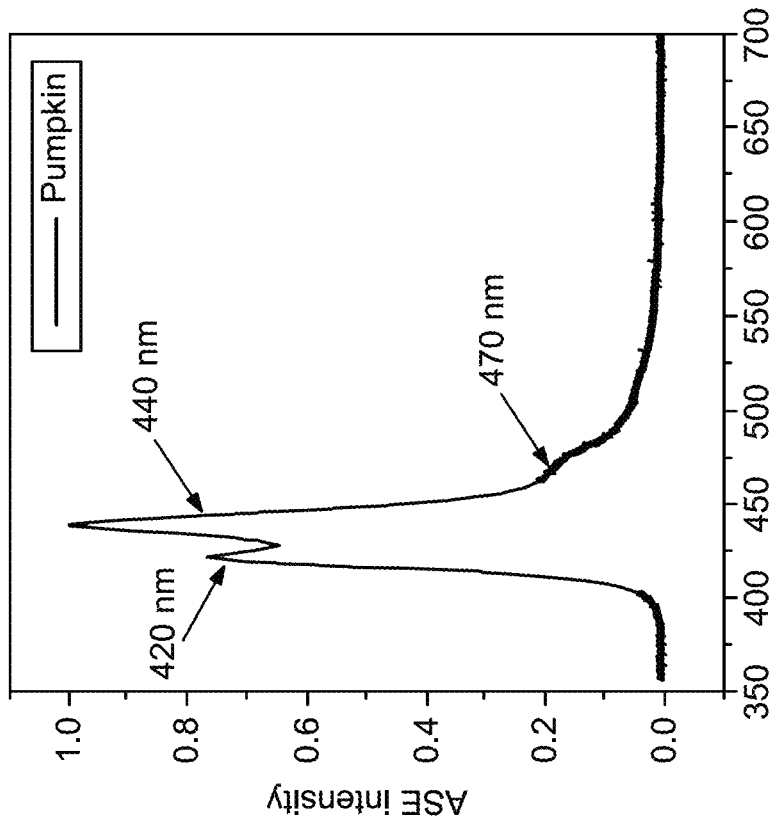
FIG. 13C is an exemplary graph of ASE spectrum of DMP in pumpkin oil at room temperature for a concentration of 10 µg/5 mL, according to certain embodiments.
Figure 13F:
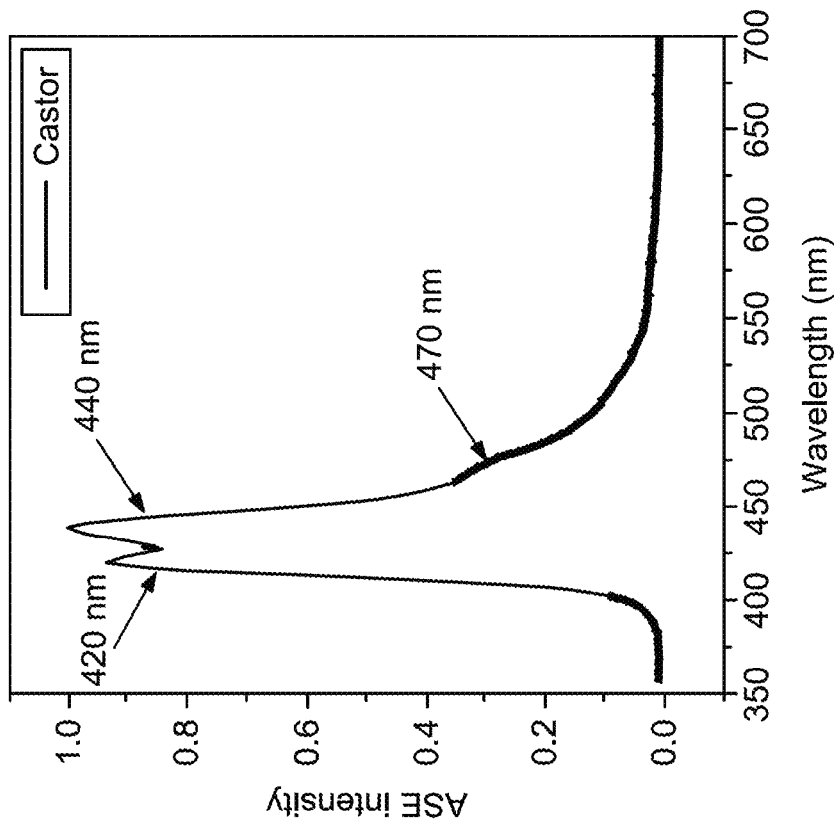
FIG. 13F is an exemplary graph of laser-induced fluorescence (LIF) spectrum of DMP in castor oil at room temperature for a concentration of 10 µg/5 mL, according to certain embodiments.
Figure 13E:
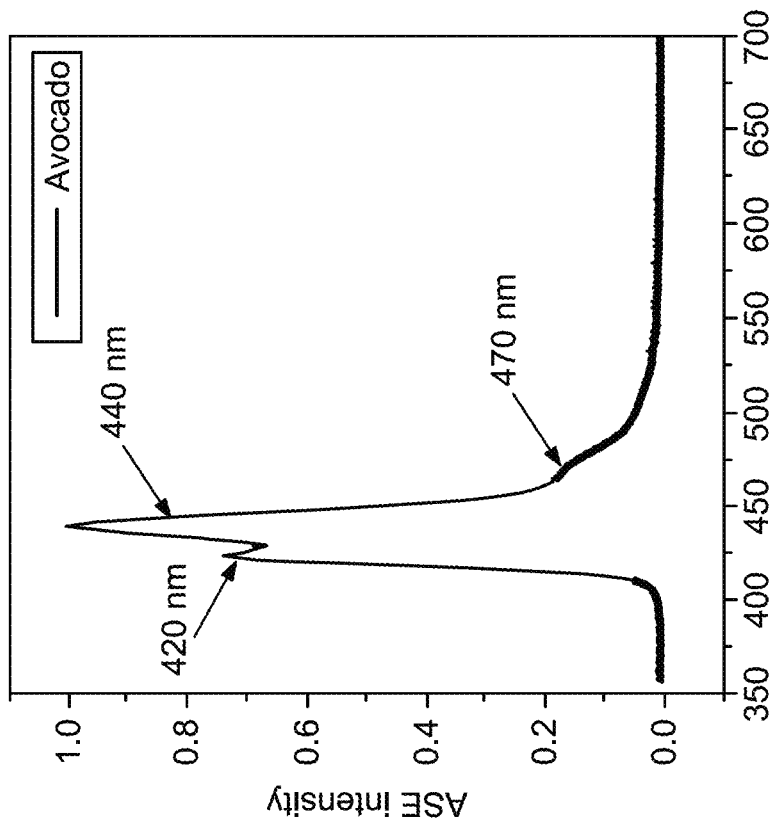
FIG. 13E is an exemplary graph of ASE spectrum of DMP in avocado oil at room temperature for a concentration of 10 µg/5 mL, according to certain embodiments.

In an embodiment, the temperature is 20° C. and there is a measurable amplified spontaneous emission (ASE) intensity. FIGS. 13A-13F present ASE spectra of DMP solutions excited using an Nd:YAG laser (355 nm, 6 mJ, 10 Hz). FIG. 13A shows lemon oil with a dominant ASE peak at 440 nm. FIG. 13B shows moringa oil displaying dual ASE peaks at 440 nm and 470 nm. FIG. 13C shows pumpkin oil generating three distinct ASE peaks at 420 nm, 440 nm, and 470 nm. FIG. 13D shows almond oil producing dual peaks at 420 nm and 440 nm. FIG. 13E shows avocado oil with triple peaks at 420 nm, 440 nm, and 470 nm. FIG. 13F shows castor oil exhibiting only laser-induced fluorescence (LIF) due to limited DMP solubility.

Figure 14:
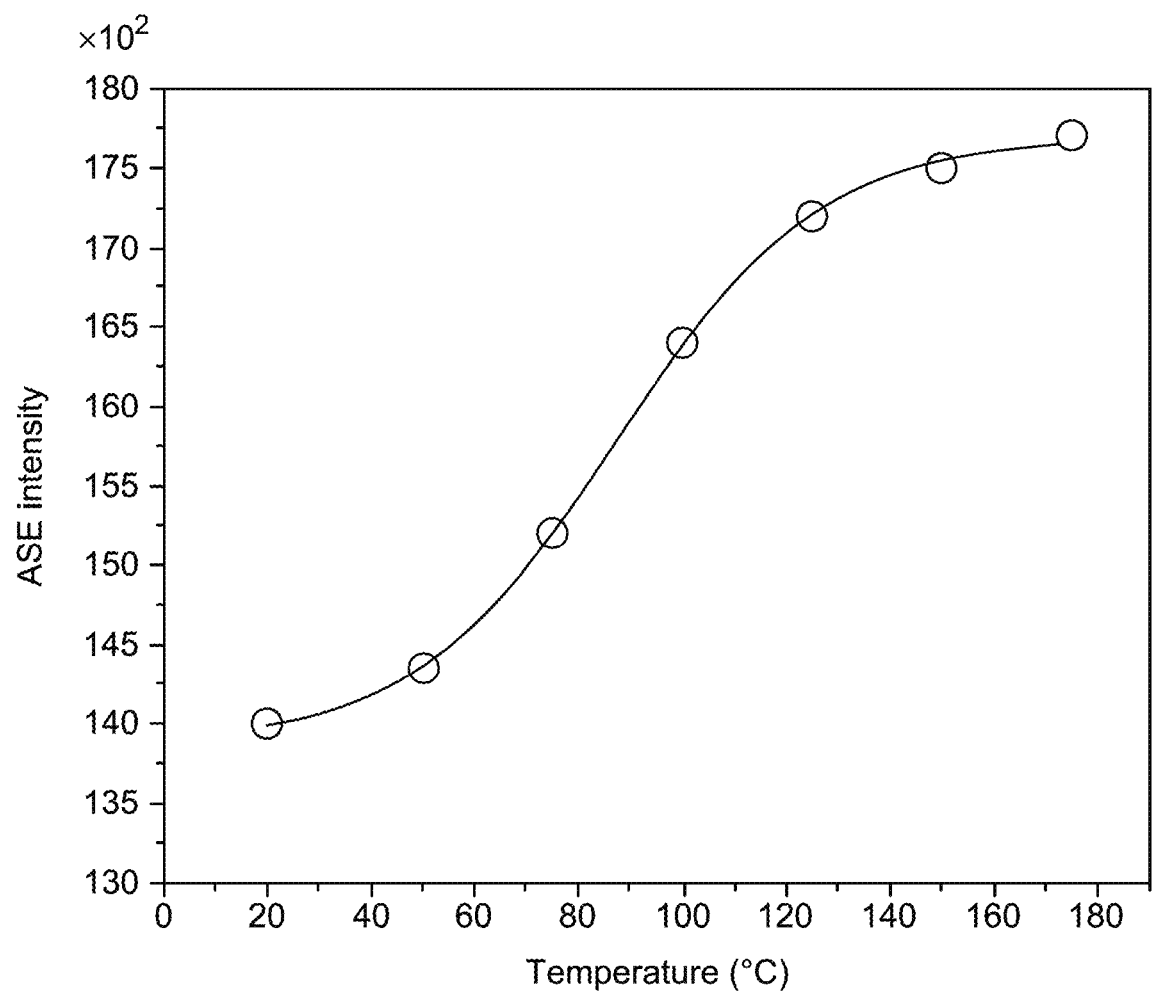
FIG. 14 is an exemplary graph presenting relationship between ASE intensity and temperature for DMP in lemon oil for a concentration of 10 µg/5 mL, according to certain embodiments.

FIG. 14 presents the relationship between ASE intensity and temperature for DMP in lemon oil at a concentration of 10 μg/5 mL. The graph shows continuous ASE intensity enhancement with increasing temperature up to 180° C., attributed to improved polymer solubility and reduced solution viscosity. In the present embodiments, as illustrated, the temperature is 80° C. and the ASE intensity is greater than or equal to 105% of the ASE intensity at 20° C. Further, as illustrated, the temperature is 100° C. and the ASE intensity is greater than or equal to 115% of the ASE intensity at 20° C. Furthermore, as illustrated, the temperature is 130° C. and the ASE intensity is greater than or equal to 120% of the ASE intensity at 20° C. Furthermore, as illustrated, the temperature is 170° C. and the ASE intensity is greater than or equal to 125% of the ASE intensity at 20° C. This progressive enhancement in ASE intensity with temperature can be attributed to the improved solubility of the polymer and changes in the viscosity of the solution at elevated temperatures, which facilitate more efficient energy transfer and excitation of the polymer molecules.

Figure 15A:
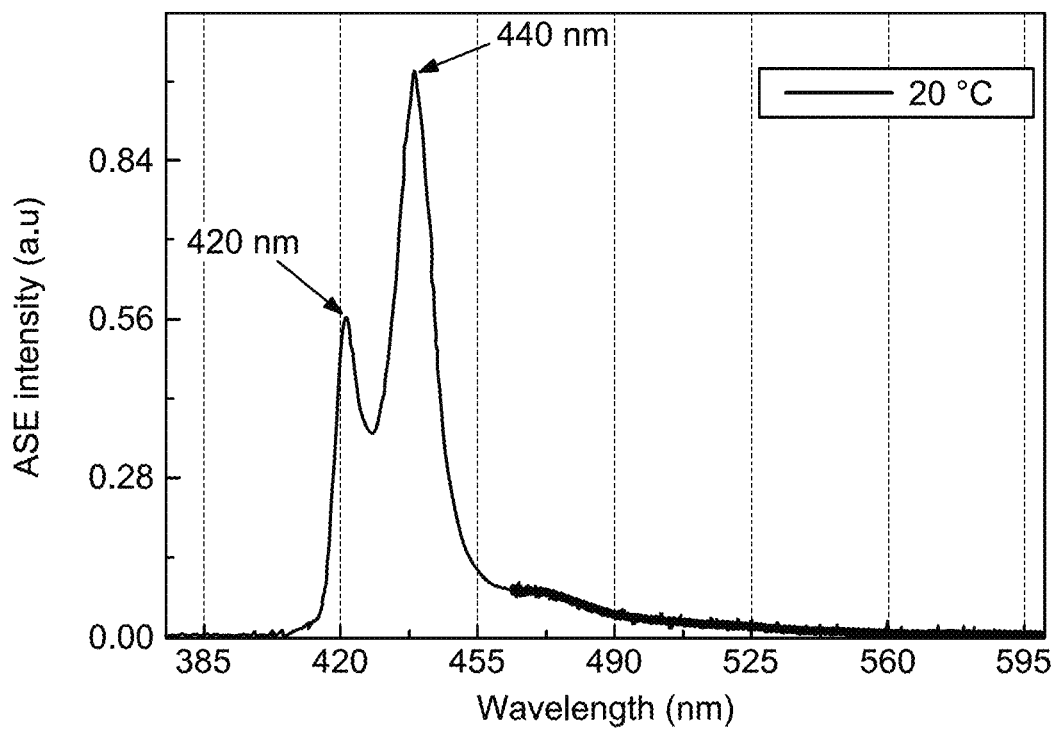
FIG. 15A is an exemplary graph of ASE spectrum of DMP in benzene at 20° C. for a concentration of 10 μg/5 mL, according to certain embodiments.
Figure 15B:
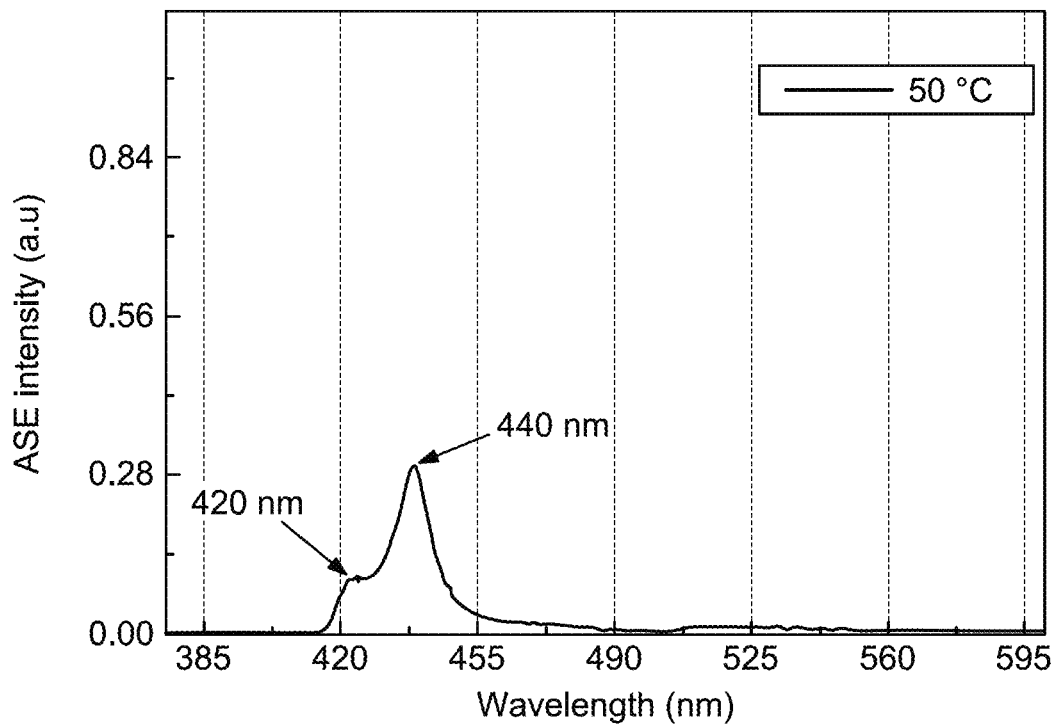
FIG. 15B is an exemplary graph of ASE spectrum of DMP in benzene at 50° C. for a concentration of 10 μg/5 mL, according to certain embodiments.
Figure 16A:
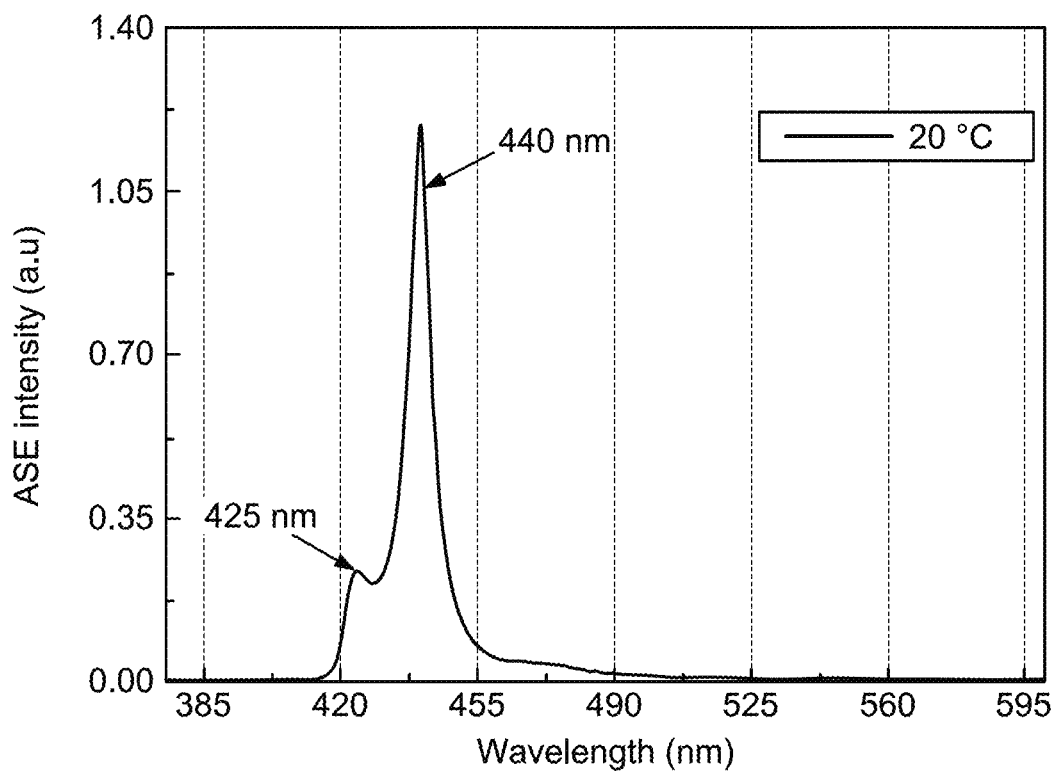
FIG. 16A is an exemplary graph of ASE spectrum of DMP in THF at 20° C. for a concentration of 10 μg/5 mL, according to certain embodiments.
Figure 16B:
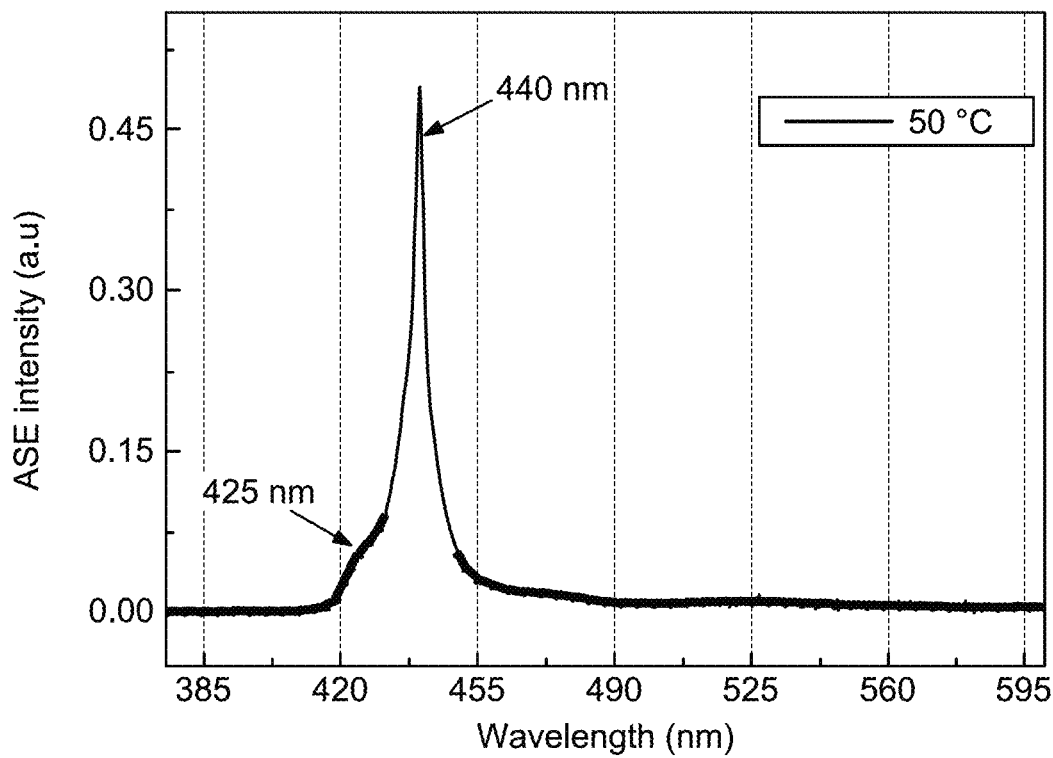
FIG. 16B is an exemplary graph of ASE spectrum of DMP in THF at 50° C. for a concentration of 10 μg/5 mL, according to certain embodiments.

FIGS. 15A-15B and FIGS. 16A-16B present comparative ASE characteristics in conventional solvents. FIGS. 15A and 15B show ASE spectra of DMP in benzene at 20° C. and 50° C. respectively, demonstrating intensity reduction to 60% of initial values at elevated temperature. Similarly, FIGS. 16A and 16B show ASE behavior in THE, showing 50% intensity reduction at 50° C. due to enhanced non-radiative decay processes and solvent volatilization effects.

Figure 17:
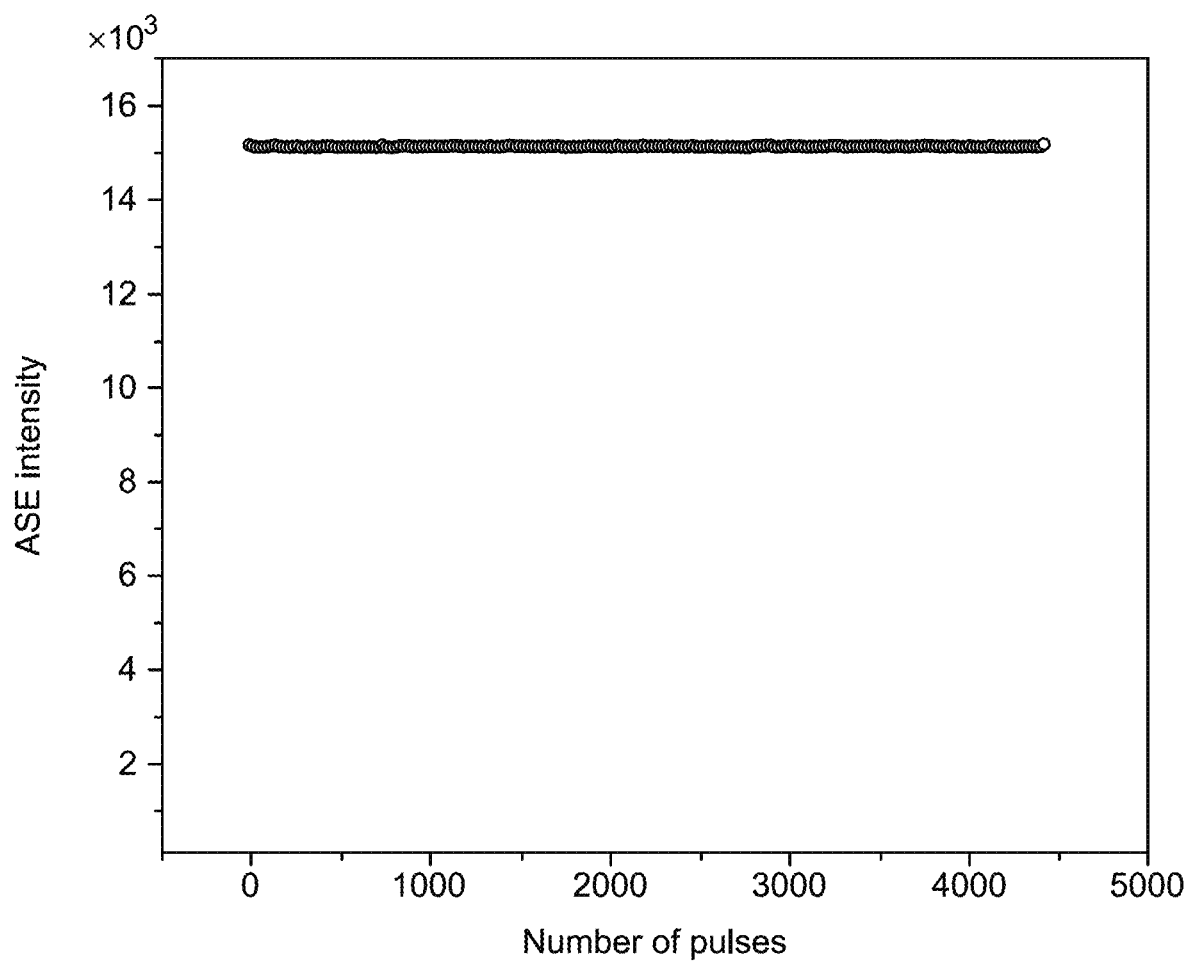
FIG. 17 is an exemplary graph depicting photochemical stability profile of DMP in lemon oil at 50° C. for a concentration of 10 μg/5 mL, according to certain embodiments.
Figure 18:
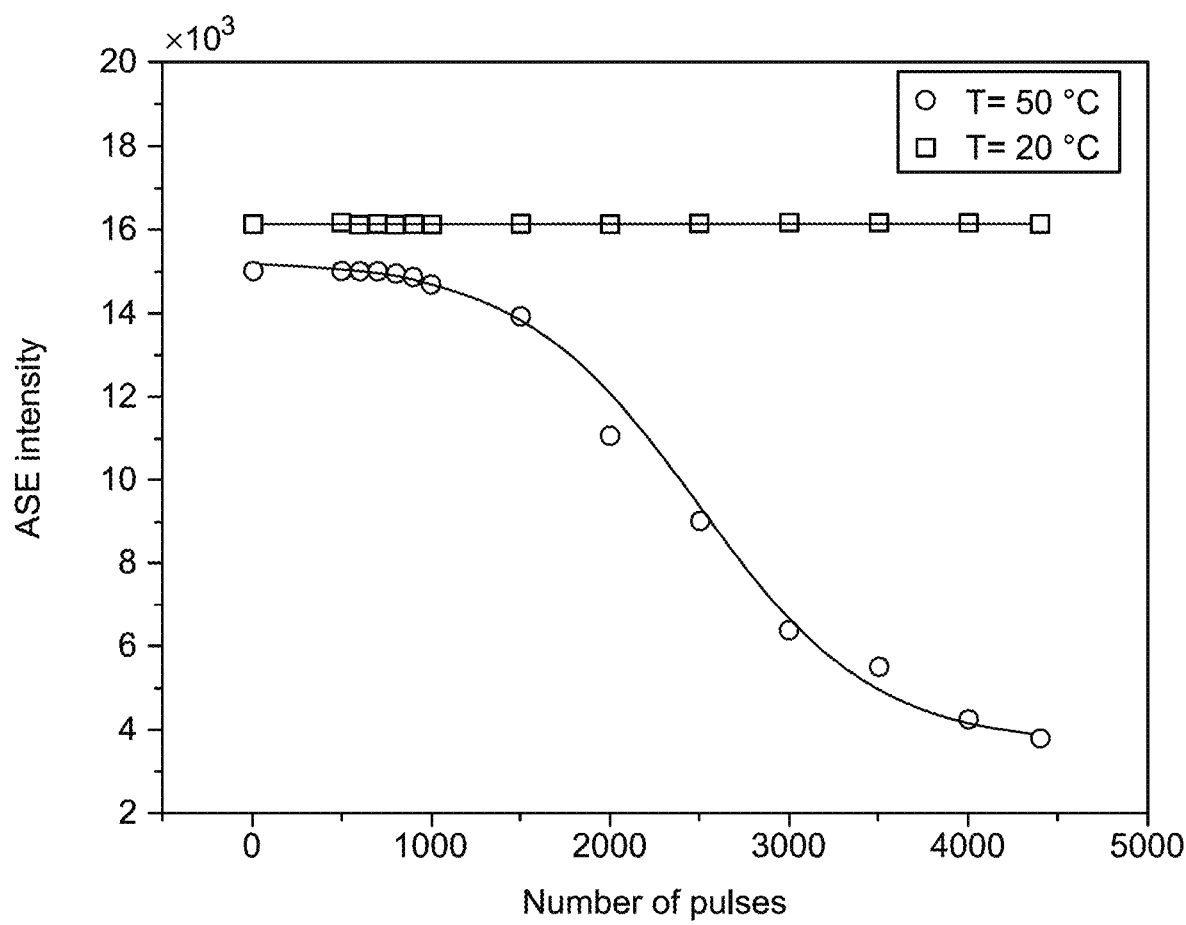
FIG. 18 is an exemplary graph depicting photochemical stability characteristics of DMP in benzene at different temperatures for a concentration of 10 μg/5 mL, according to certain embodiments.

In an embodiment, the method 200 further comprises maintaining photochemical stability for 2000 or greater pulses, where the photochemical stability is defined as maintaining an ASE at greater than or of equal to 95% of an initially measured value. Herein, the system 100 is capable of maintaining photochemical stability for 2000 or greater pulses, where the photochemical stability is defined as maintaining an ASE at greater than or of equal to 95% of an initially measured value. FIG. 17 presents photochemical stability characteristics of DMP in lemon oil at 50° C. with a concentration of 10 μg/5 mL. The stability profile was measured under controlled excitation conditions with pump pulse energy of 6 mJ and repetition rate of 10 Hz. In the present embodiments, the photochemical stability is maintained for 3000 or greater pulses. More preferably, the photochemical stability is maintained for 4000 or greater pulses. This is achieved with ASE intensity remaining above 95% of initial values throughout the extended operational period, demonstrating exceptional thermal and photochemical resilience of the DMP-lemon oil system. FIG. 18 presents comparative photochemical stability data for DMP in benzene at variable temperatures. At 20° C., the system 100 maintains relatively stable ASE output. However, at elevated temperature (50° C.), the ASE intensity exhibits degradation, decreasing to 50% of initial values after approximately 3000 pulses. This thermal degradation pattern demonstrates fundamental limitations of conventional solvent systems under elevated temperature conditions.

Figure 19:
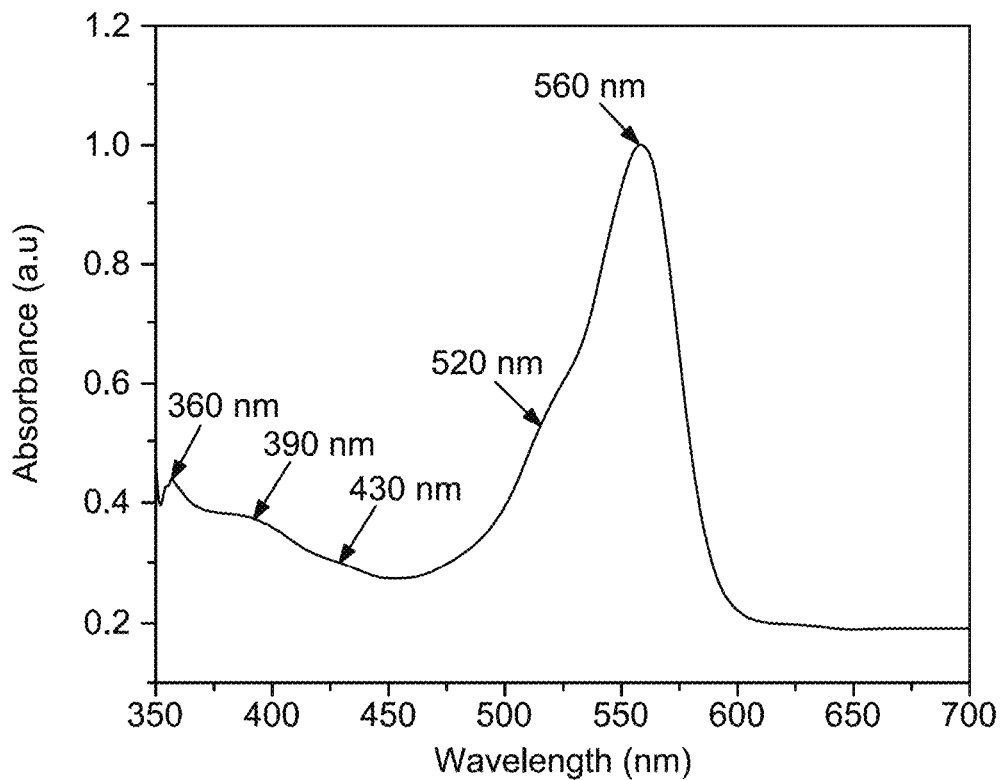
FIG. 19 is an exemplary graph of absorption spectrum of Rh-B in castor oil at room temperature for a concentration of 1 μg/5 mL, according to certain embodiments.
Figure 20:
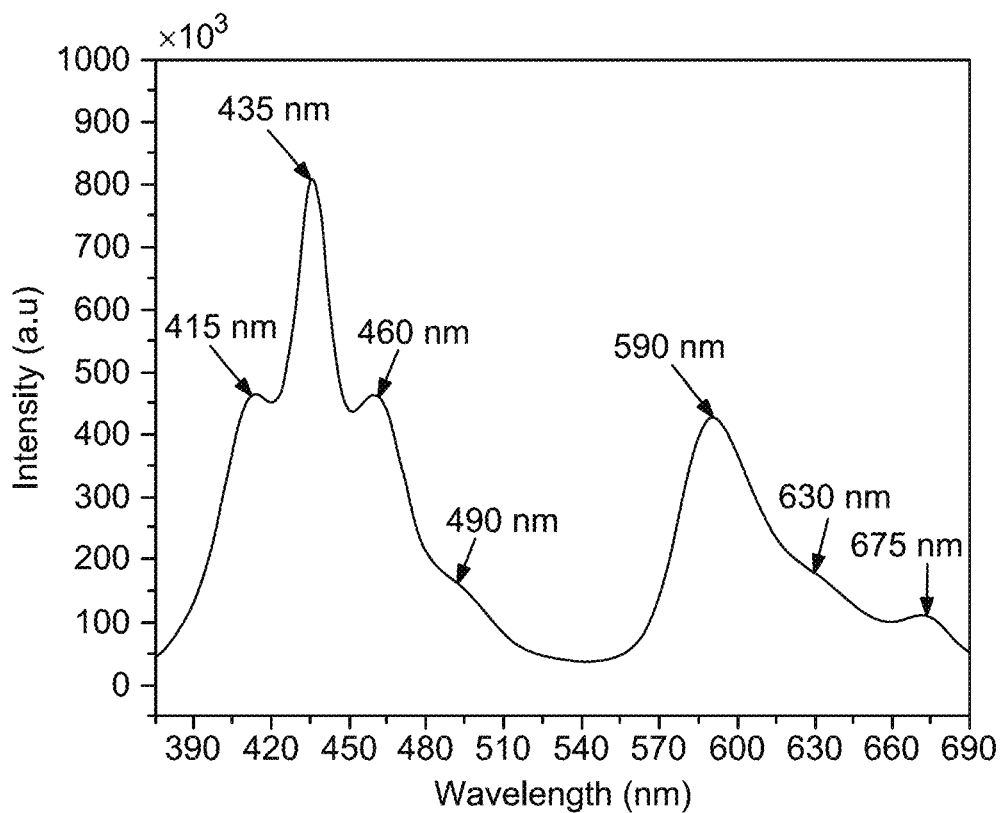
FIG. 20 is an exemplary graph of emission spectrum of Rh-B in castor oil at room temperature for a concentration of 1 μg/5 mL, according to certain embodiments.

In an embodiment, the oil is castor oil and the dye is rhodamine B. In one or more embodiments, the concentration of rhodamine B in castor oil is in a range from 1 to 3 μg/mL. FIG. 19 presents absorption characteristics of Rh-B in castor oil at room temperature with a concentration of 1 μg/5 mL. The absorption spectrum exhibits multiple characteristic peaks: primary absorption maxima at 360 nm, 390 nm, 430 nm, and 520 nm, with a dominant peak at 560 nm. This complex absorption profile indicates effective solubilization and specific molecular interactions within the castor oil environment. FIG. 20 presents emission spectral characteristics of Rh-B in castor oil at identical concentration conditions. The emission profile demonstrates multiple peaks across an extended spectral range: 415 nm, 435 nm, 460 nm, 490 nm attributable to intrinsic castor oil characteristics; 590 nm corresponding to primary Rh-B emission; and 630 nm, 675 nm peaks indicating dipole-dipole interactions between Rh-B molecules and the castor oil medium.

Figure 21A:
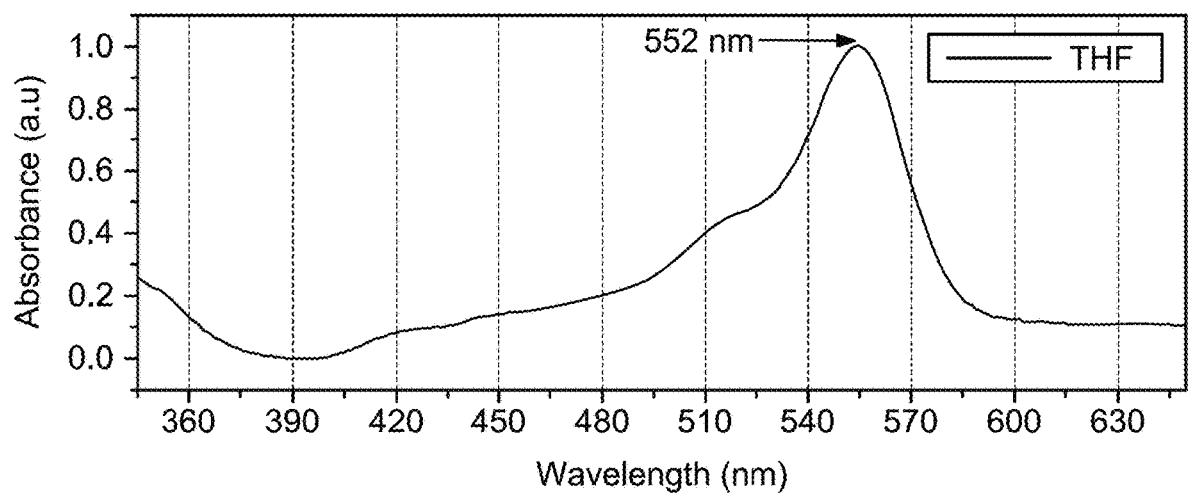
FIG. 21A is an exemplary graph of absorption spectrum of Rh-B in THF at room temperature for a concentration of 1 μg/5 mL, according to certain embodiments.
Figure 21B:
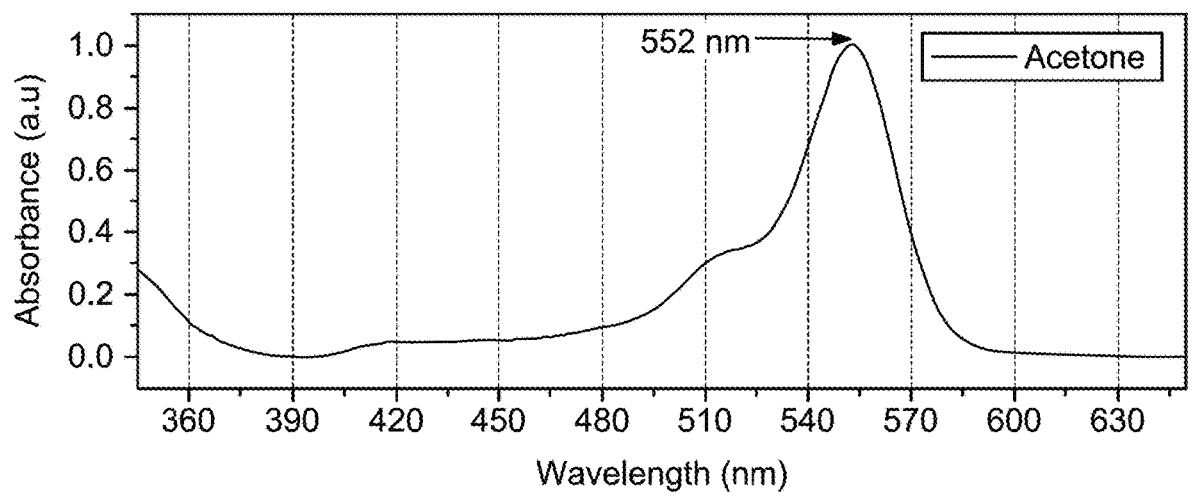
FIG. 21B is an exemplary graph of absorption spectrum of Rh-B in acetone at room temperature for a concentration of 1 μg/5 mL, according to certain embodiments.

FIGS. 21A and 21B present comparative absorption characteristics of Rh-B in conventional organic solvents (THF and acetone respectively) at room temperature with concentration of 1 μg/5 mL. Both solvents exhibit nearly identical absorption profiles with a characteristic peak at 552 nm. The spectral similarity indicates comparable solvent-solute interactions in these conventional polar organic media, demonstrating fundamentally different solvation behavior compared to the natural oil system.

Figure 22A:
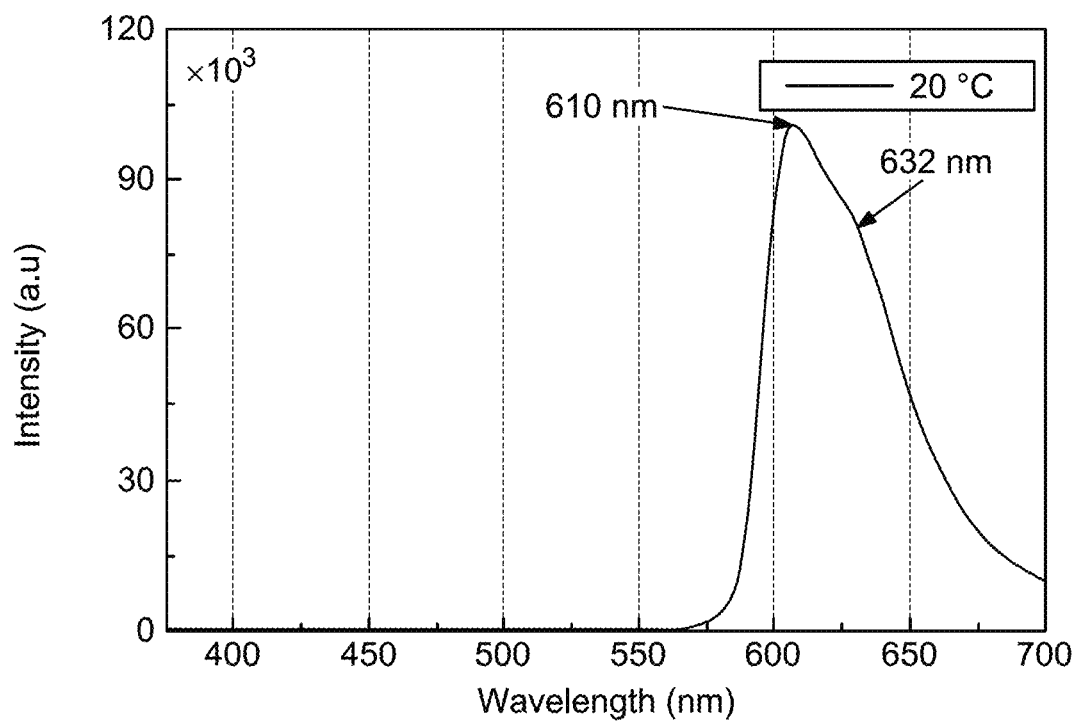
FIG. 22A is an exemplary graph of emission spectrum of Rh-B in acetone at 20° C. for a concentration of 10 μg/5 mL, according to certain embodiments.
Figure 22B:
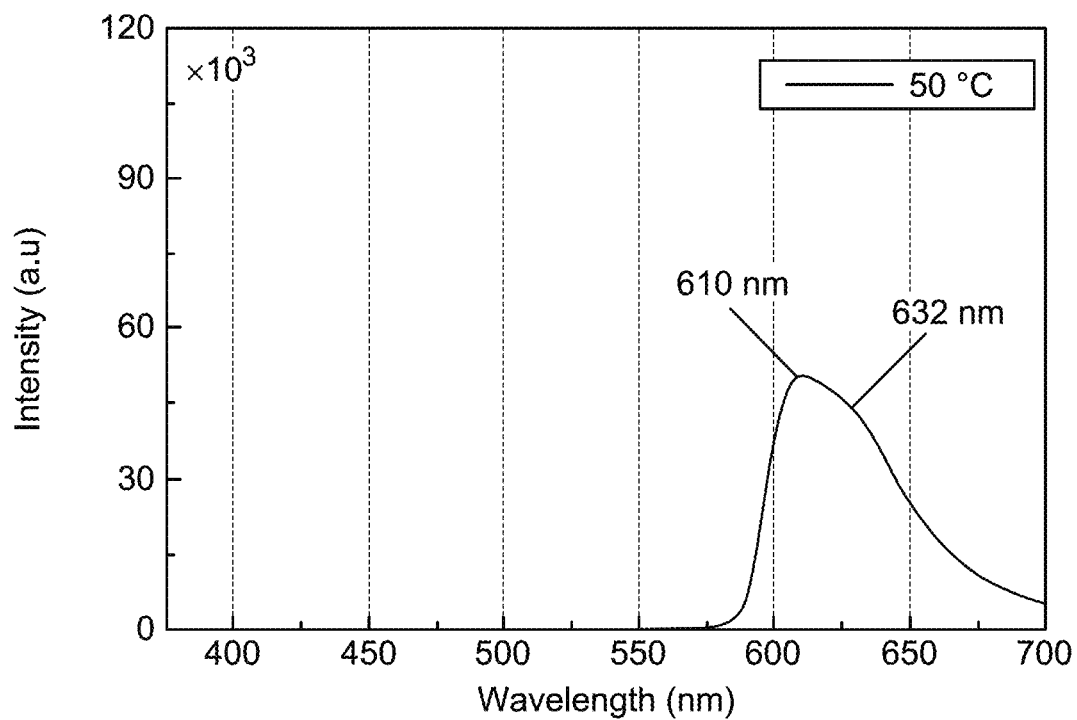
FIG. 22B is an exemplary graph of emission spectrum of Rh-B in acetone at 50° C. for a concentration of 10 μg/5 mL, according to certain embodiments.

FIGS. 22A and 22B present emission spectra of Rh-B in acetone at 20° C. and 50° C. respectively, with concentration maintained at 10 μg/5 mL. The spectra show two characteristic peaks at 610 nm and 632 nm. While peak positions remain constant, thermal effects manifest through intensity modulation, with approximately 30% reduction in emission intensity at elevated temperature. The temperature-dependent intensity attenuation demonstrates thermal sensitivity of the conventional solvent system.

Figure 23:
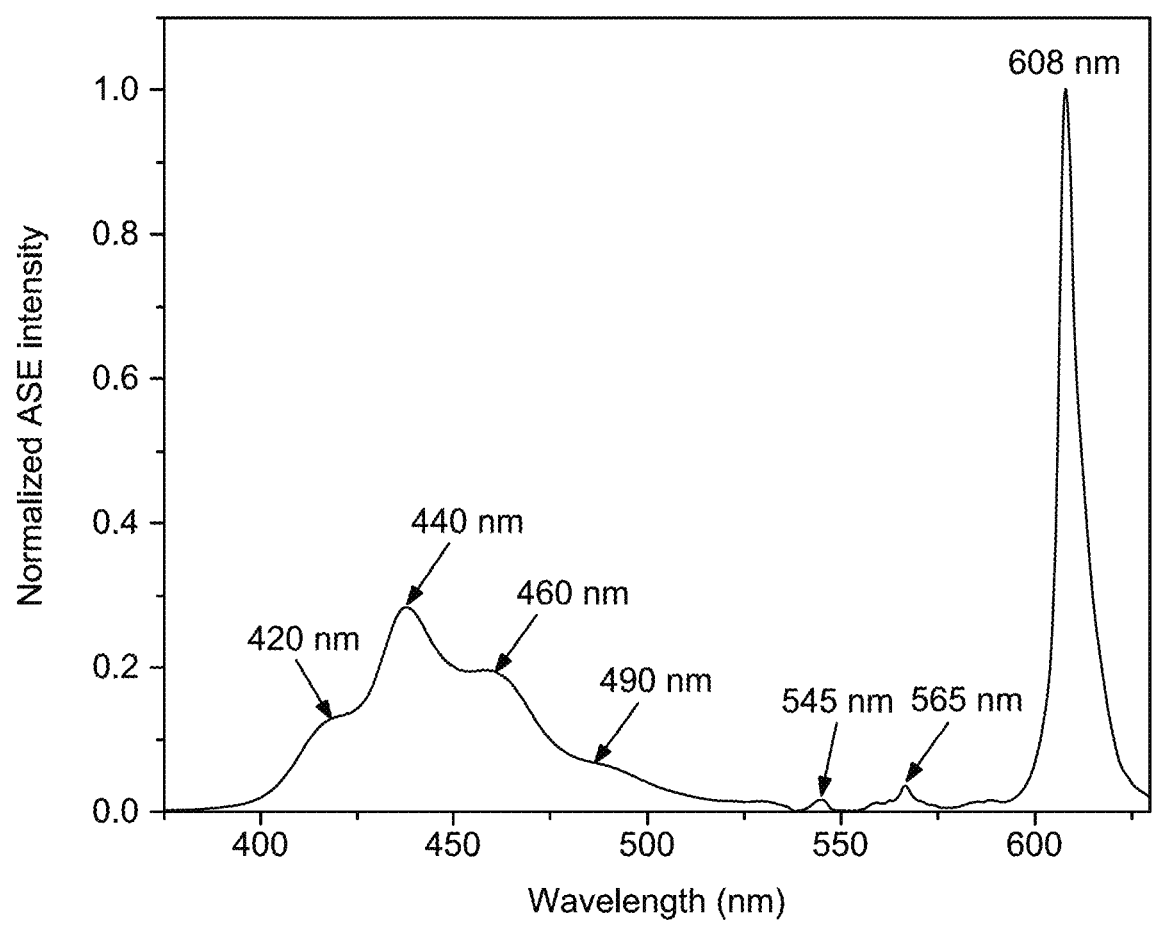
FIG. 23 is an exemplary graph of ASE spectrum of Rh-B in castor oil at room temperature for a concentration of 10 μg/5 mL, according to certain embodiments.

FIG. 23 presents the ASE spectrum of Rh-B in castor oil at room temperature with 10 μg/5 mL concentration. The spectrum exhibits multiple ASE peaks at precisely defined wavelengths: 420 nm, 440 nm, 460 nm, 490 nm in the blue-green region; 545 nm and 565 nm in the yellow-green region; and a dominant peak at 608 nm in the red region. This multi-wavelength ASE behavior demonstrates the capacity of Rh-B to achieve laser-active states across a broad spectral range within the castor oil environment, enabling potential wavelength-tunable applications.

Figure 24:
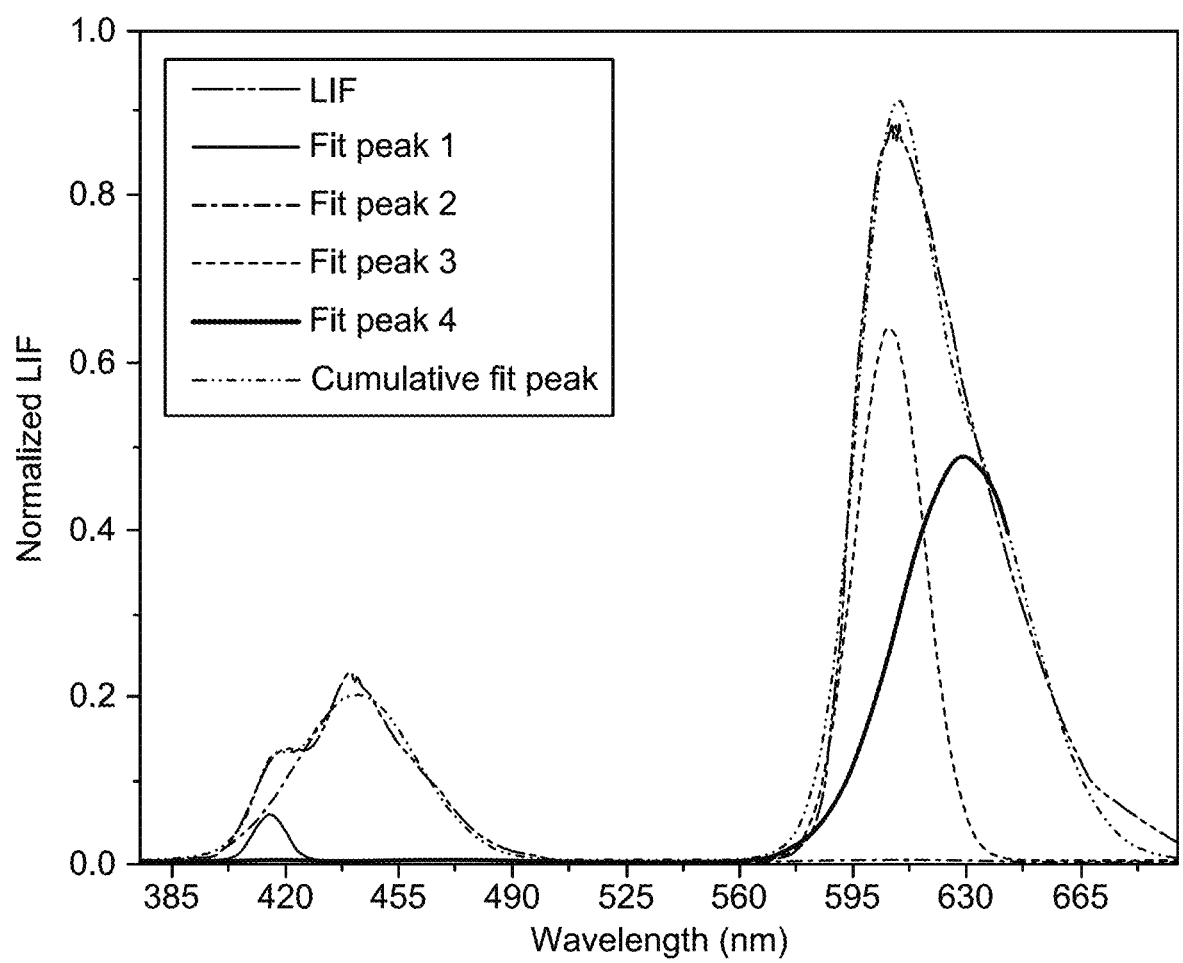
FIG. 24 is an exemplary graph of LIF spectrum of Rh-B in castor oil at elevated temperature of 50° C. for a concentration of 10 μg/5 mL, according to certain embodiments.

FIG. 24 presents laser-induced fluorescence (LIF) characteristics of Rh-B in castor oil at elevated temperature (50° C.) with maintained concentration of 10 μg/5 mL. The LIF spectrum exhibits four distinct deconvoluted peaks at 405 nm, 437 nm, 613 nm, and 645 nm, demonstrating complete transition from ASE to fluorescence emission under thermal conditions. This spectral evolution indicates temperature-dependent modification of the excited state dynamics within the natural oil medium.

Figure 25A:
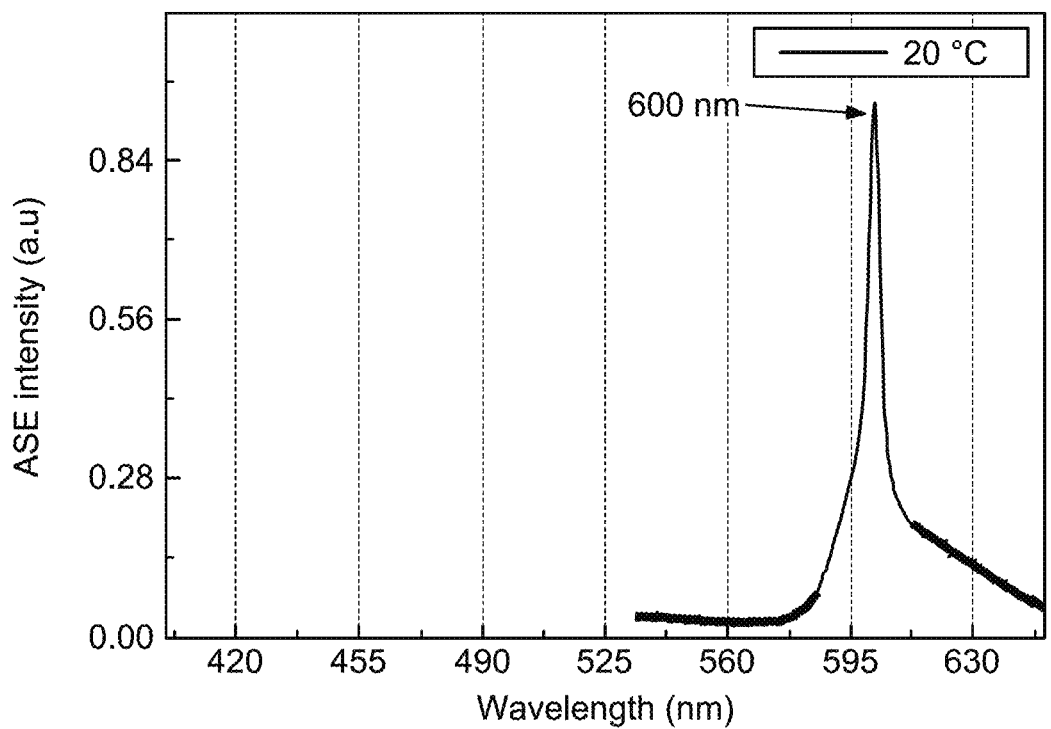
FIG. 25A is an exemplary graph of ASE spectrum of Rh-B in acetone at 20° C. for a concentration of 10 μg/5 mL, according to certain embodiments.
Figure 25B:
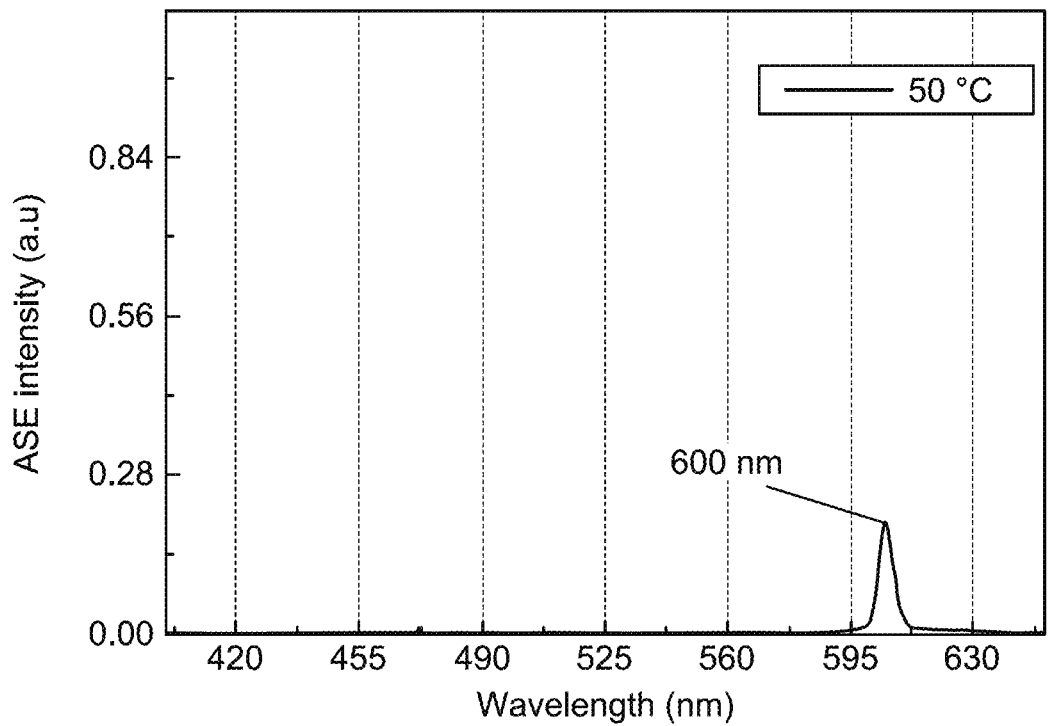
FIG. 25B is an exemplary graph of ASE spectrum of Rh-B in acetone at 50° C. for a concentration of 10 μg/5 mL, according to certain embodiments.
Figure 26:
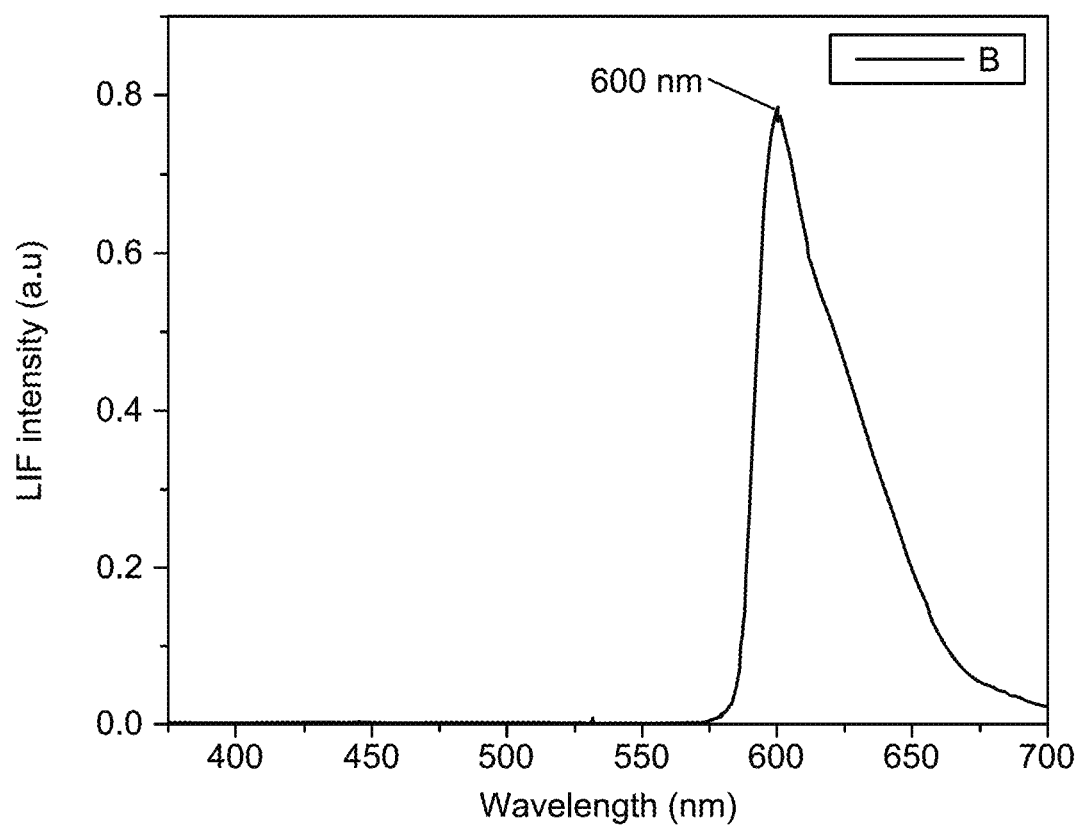
FIG. 26 is an exemplary graph of LIF spectrum of Rh-B in THF at room temperature for a concentration of 10 μg/5 mL, according to certain embodiments.

FIGS. 25A and 25B present ASE spectra of Rh-B in acetone at 20° C. and 50° C. respectively. At room temperature, the spectrum shows a single prominent ASE peak at 600 nm. Elevation to 50° C. results in intensity reduction while maintaining peak position, demonstrating thermal sensitivity without spectral shifting. FIG. 26 shows LIF spectrum of Rh-B in THF at room temperature, exhibiting only fluorescence emission centered at 600 nm with no ASE activity, attributed to limited solubility effects.

In general, the present disclosure provides a thermo-boost laser technique that advances the field of dye laser technology through strategic thermal management integration. The system 100 and the method 200 of the present disclosure employs natural oils including moringa, avocado, almond, castor, pumpkin, and lemon oils as solvents for dye compounds, enabling operation at elevated temperatures up to 180° C. while maintaining photochemical stability. The proposed approach of utilizing controlled heating rather than conventional cooling represents a departure from traditional dye laser designs, demonstrating enhanced amplified spontaneous emission (ASE) intensity with increasing temperature, achieving up to 125% of the ASE intensity at 20° C. when operated at 170° C.

The system 100 and the method 200 of the present disclosure achieve high operational efficiency through integration of the active temperature control apparatus 118 and the dye preparation unit 112. The proposed techniques maintain stable temperature control within ±0.1° C. across the operating range through coordinated operation of the rotator 116, which provides uniform mixing at 0-3000 rpm, and the active temperature control apparatus 118, which enables programmed heating rates of 2° C./min. This precise thermal management, combined with the modulation by the optical chopper 104 and the beam shaping by the cylindrical lens 110, enables consistent wavelength selection through the grating 120 while maintaining photochemical stability. Further, in the system 100, the dye solution pump 122 maintains precise flow rates between 0.1-10 mL/min, enabling continuous operation while preserving the enhanced performance characteristics achieved through strategic thermal management and natural oil solvation.

The system 100 and the method 200 of the present disclosure provides substantial advantages over conventional dye laser systems through its thermal management and solvent selection approach. Where traditional systems suffer from thermal degradation and reduced performance at elevated temperatures, the present system 100 and method 200 maintain photochemical stability for 4000 or greater pulses while operating at temperatures up to 180° C. The use of natural oils as solvents, particularly for poly(9,9-didodecylfluorenyl-2,7-diyl)-end-capped with dimethylphenyl in lemon oil and rhodamine B in castor oil at concentrations of 1 to 3 μg/mL, enables desirable thermal stability compared to conventional organic solvents like benzene and tetrahydrofuran which show 40-50% reduction in ASE intensity at just 50° C. This enhanced thermal stability eliminates the need for complex cooling systems while simultaneously improving laser performance.

Figure 27:
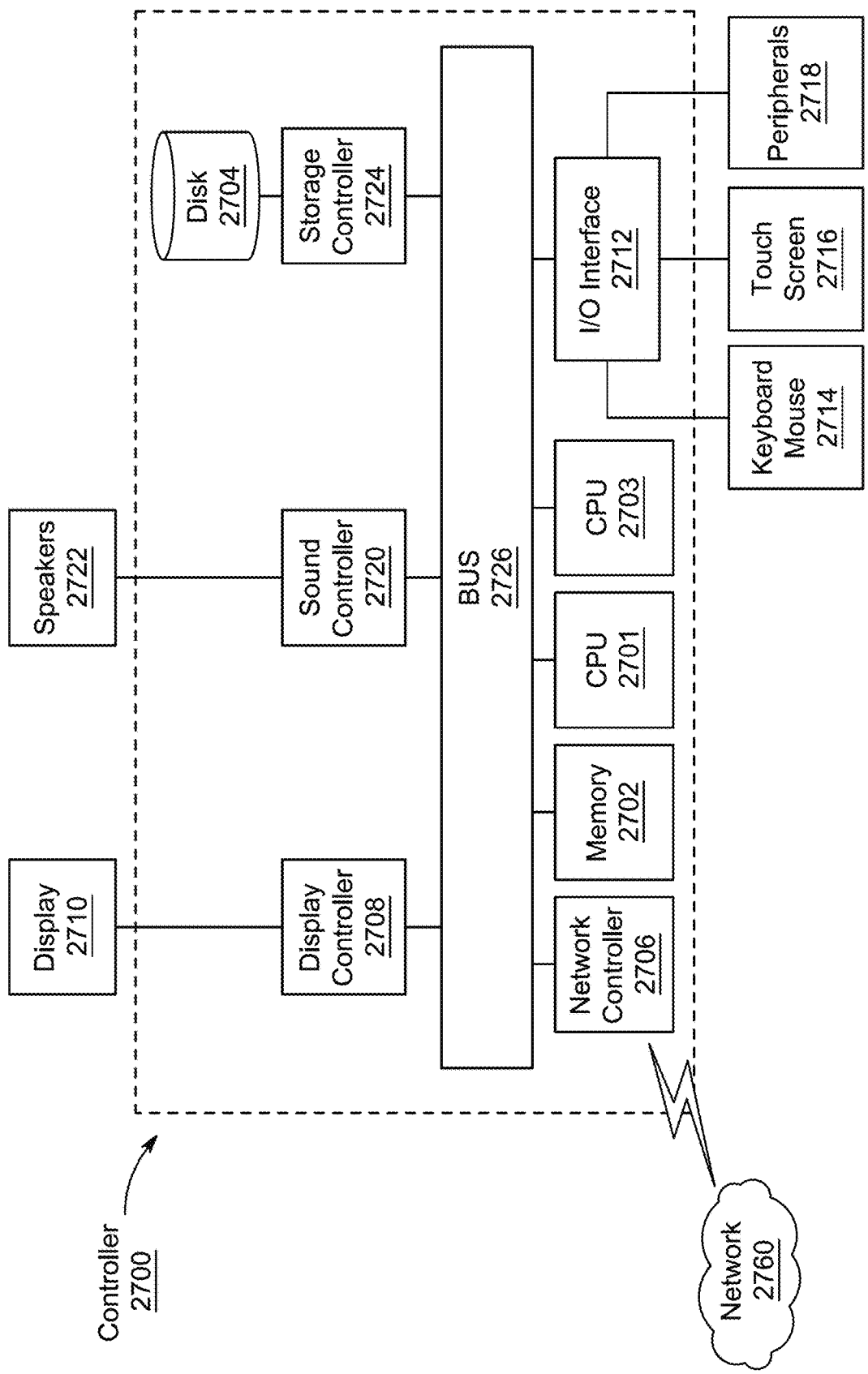
FIG. 27 is an illustration of a non-limiting example of details of computing hardware used in the computing system, according to certain embodiments.

Next, further details of the hardware description of a computing environment according to exemplary embodiments is described with reference to FIG. 27. It may be appreciated that such computing environment may be implemented for automating the processes for the system 100 and the method 200 of the present disclosure. In FIG. 27, a controller 2700 is described, in which the controller 2700 includes a CPU 2701 which performs the processes described above/below. The process data and instructions may be stored in memory 2702. These processes and instructions may also be stored on a storage medium disk 2704 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 2701, 2703 and an operating system such as Microsoft Windows 7, Microsoft Windows 8, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU 2701 or CPU 2703 may be a Xenon or Core processor from Intel of America or an Opteron processor from AMD of America, or may be other processor types that would be recognized by one of ordinary skill in the art. Alternatively, the CPU 2701, 2703 may be implemented on an FPGA, ASIC, PLD or using discrete logic circuits, as one of ordinary skill in the art would recognize. Further, CPU 2701, 2703 may be implemented as multiple processors cooperatively working in parallel to perform the instructions of the inventive processes described above.

The computing device in FIG. 27 also includes a network controller 2706, such as an Intel Ethernet PRO network interface card from Intel Corporation of America, for interfacing with network 2760. As can be appreciated, the network 2760 can be a public network, such as the Internet, or a private network such as an LAN or WAN network, or any combination thereof and can also include PSTN or ISDN sub-networks. The network 2760 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 2708, such as a NVIDIA Geforce GTX or Quadro graphics adaptor from NVIDIA Corporation of America for interfacing with display 2710, such as a Hewlett Packard HPL2445w LCD monitor. A general purpose I/O interface 2712 interfaces with a keyboard and/or mouse 2714 as well as a touch screen panel 2716 on or separate from display 2710. General purpose I/O interface also connects to a variety of peripherals 2718 including printers and scanners, such as an OfficeJet or DeskJet from Hewlett Packard.

A sound controller 2720 is also provided in the computing device such as Sound Blaster X-Fi Titanium from Creative, to interface with speakers/microphone 2722 thereby providing sounds and/or music.

The general purpose storage controller 2724 connects the storage medium disk 2704 with communication bus 2726, which may be an ISA, EISA, VESA, PCI, or similar, for interconnecting all of the components of the computing device. A description of the general features and functionality of the display 2710, keyboard and/or mouse 2714, as well as the display controller 2708, storage controller 2724, network controller 2706, sound controller 2720, and general purpose I/O interface 2712 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 28.

Figure 28:
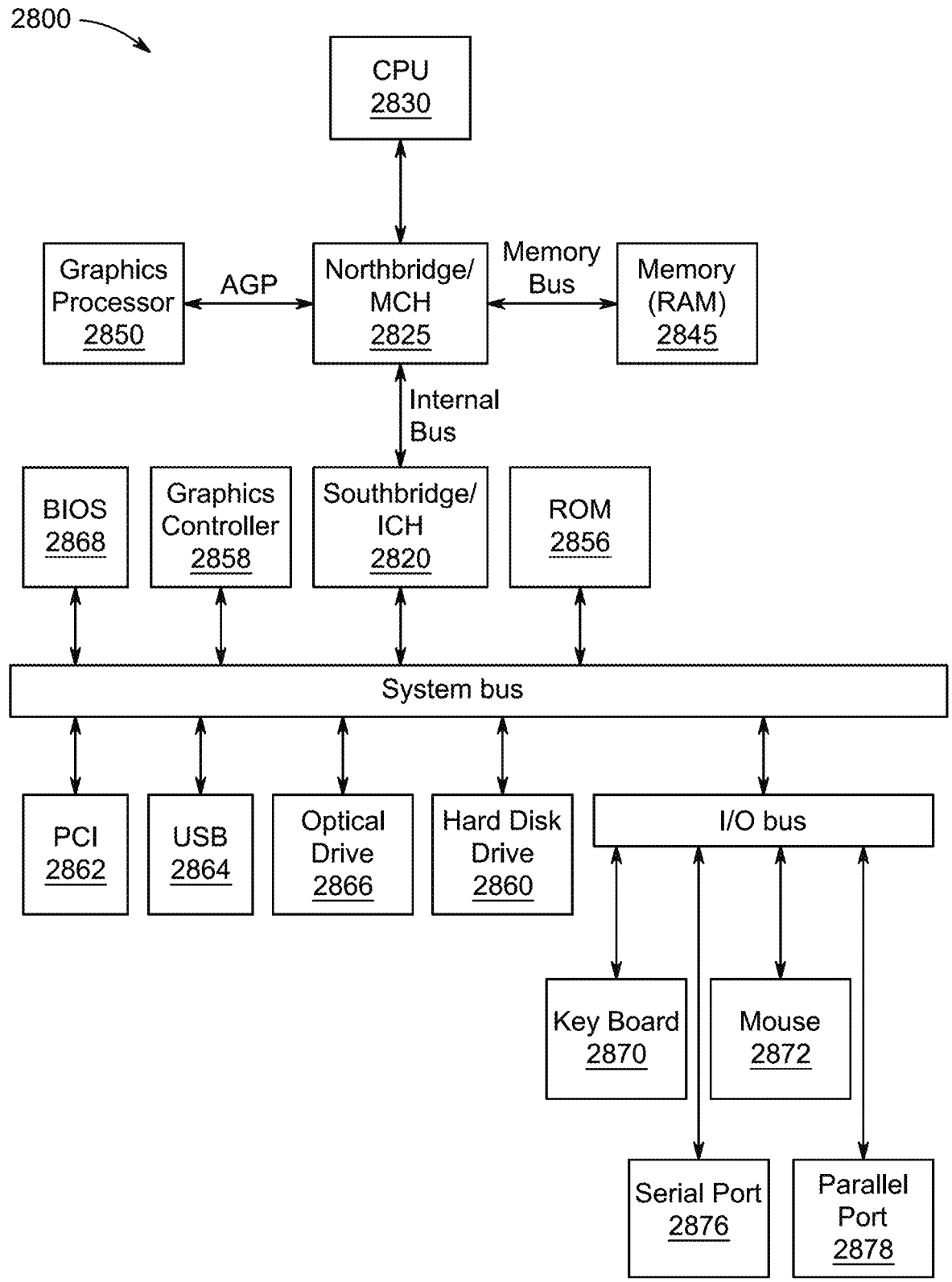
FIG. 28 is an exemplary schematic diagram of a data processing system used within the computing system, according to certain embodiments.

FIG. 28 shows a schematic diagram of a data processing system, according to certain embodiments, for performing the functions of the exemplary embodiments. The data processing system is an example of a computer in which code or instructions implementing the processes of the illustrative embodiments may be located.

In FIG. 28, data processing system 2800 employs a hub architecture including a north bridge and memory controller hub (NB/MCH) 2825 and a south bridge and input/output (I/O) controller hub (SB/ICH) 2820. The central processing unit (CPU) 2830 is connected to NB/MCH 2825. The NB/MCH 2825 also connects to the memory 295 via a memory bus, and connects to the graphics processor 300 via an accelerated graphics port (AGP). The NB/MCH 2825 also connects to the SB/ICH 2820 via an internal bus (e.g., a unified media interface or a direct media interface). The CPU Processing unit 2830 may contain one or more processors and even may be implemented using one or more heterogeneous processor systems.

Figure 29:
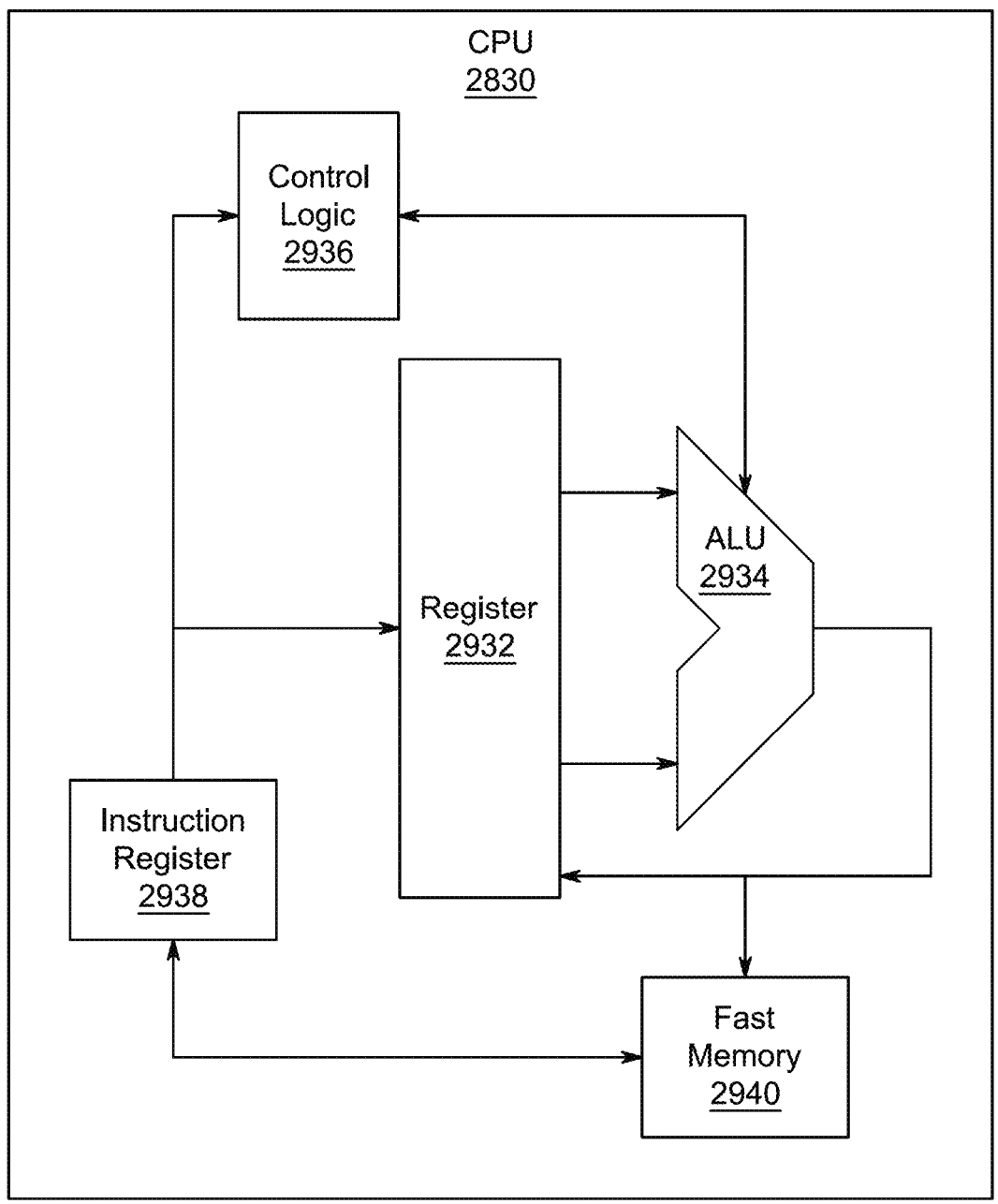
FIG. 29 is an exemplary schematic diagram of a processor used with the computing system, according to certain embodiments.

For example, FIG. 29 shows one implementation of CPU 2830. In one implementation, the instruction register 2938 retrieves instructions from the fast memory 2940. At least part of these instructions are fetched from the instruction register 2938 by the control logic 2936 and interpreted according to the instruction set architecture of the CPU 2830. Part of the instructions can also be directed to the register 2932. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 2934 that loads values from the register 2932 and performs logical and mathematical operations on the loaded values according to the instructions. The results from these operations can be feedback into the register and/or stored in the fast memory 2940. According to certain implementations, the instruction set architecture of the CPU 2830 can use a reduced instruction set architecture, a complex instruction set architecture, a vector processor architecture, a very large instruction word architecture. Furthermore, the CPU 2830 can be based on the Von Neuman model or the Harvard model. The CPU 2830 can be a digital signal processor, an FPGA, an ASIC, a PLA, a PLD, or a CPLD. Further, the CPU 2830 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 28, the data processing system 2800 can include that the SB/ICH 2820 is coupled through a system bus to an I/O Bus, a read only memory (ROM) 306, universal serial bus (USB) port 2864, a flash binary input/output system (BIOS) 2868, and a graphics controller 308. PCI/PCIe devices can also be coupled to SB/ICH 2888 through a PCI bus 2862.

The PCI devices may include, for example, Ethernet adapters, add-in cards, and PC cards for notebook computers. The Hard disk drive 2860 and CD-ROM 2866 can use, for example, an integrated drive electronics (IDE) or serial advanced technology attachment (SATA) interface. In one implementation the I/O bus can include a super I/O (SIO) device.

Further, the hard disk drive (HDD) 2860 and optical drive 2866 can also be coupled to the SB/ICH 2820 through a system bus. In one implementation, a keyboard 2870, a mouse 2872, a parallel port 2878, and a serial port 2876 can be connected to the system bus through the I/O bus. Other peripherals and devices that can be connected to the SB/ICH 2820 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry or based on the requirements of the intended back-up load to be powered.

Figure 30:
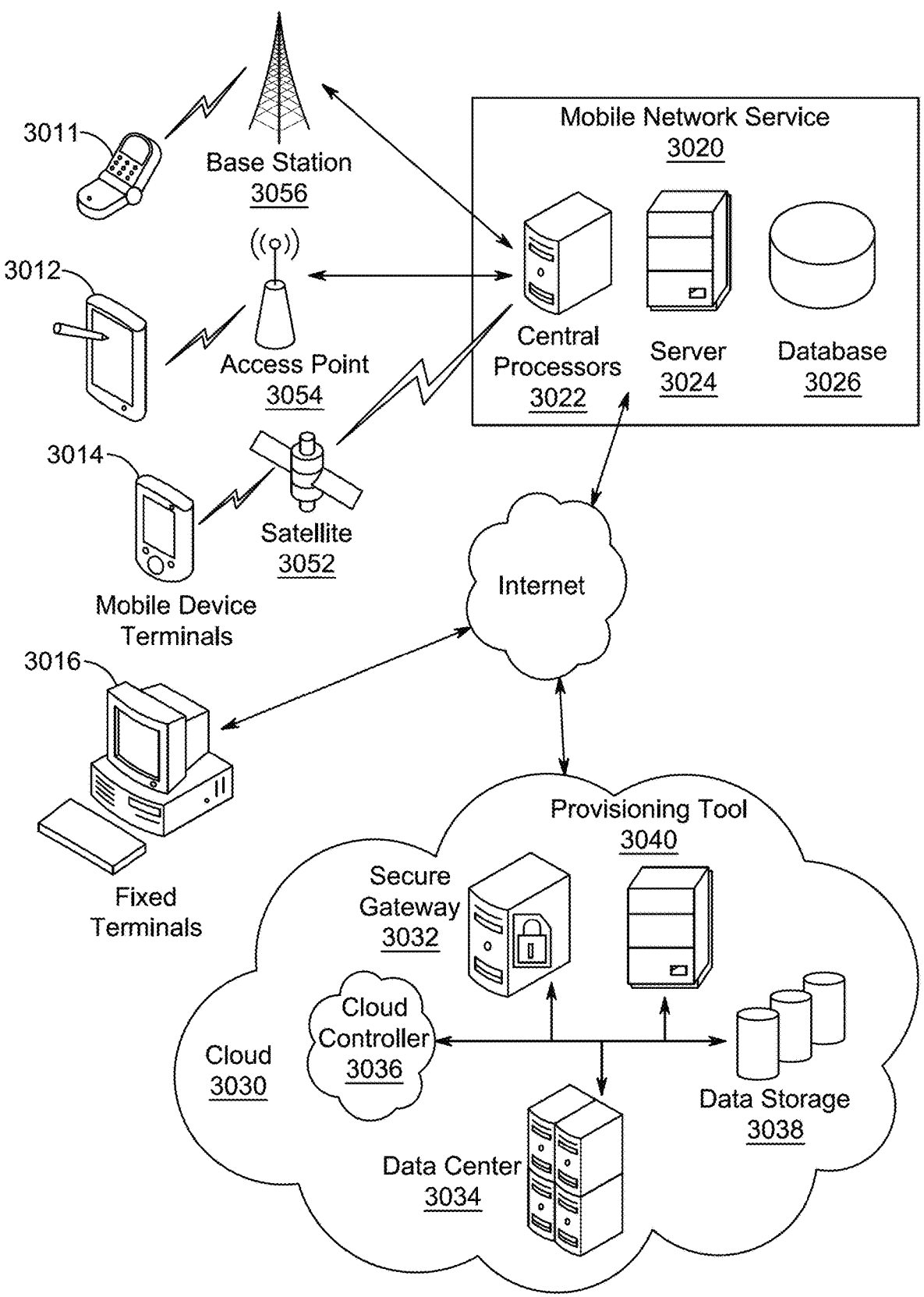
FIG. 30 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, such as cloud 3030 including a cloud controller 3036, a secure gateway 3032, a data center 3034, data storage 3038 and a provisioning tool 3040, and mobile network services 3020 including central processors 3022, a server 3024 and a database 3026, which may share processing, as shown by FIG. 30, in addition to various human interface and communication devices (e.g., display monitors 3016, smart phones 3010, tablets 3012, personal digital assistants (PDAs) 3014). The network may be a private network, such as a LAN, satellite 3052 or WAN 3054, or be a public network, may such as the Internet. Input to the system may be received via direct user input and received remotely either in real-time or as a batch process. Additionally, some implementations may be performed on modules or hardware not identical to those described. Accordingly, other implementations are within the scope that may be claimed.

While specific embodiments of the invention have been described, it should be understood that various modifications and alternatives may be implemented without departing from the spirit and scope of the invention. For example, different cellular automata rules or encryption algorithms could be employed, or alternative feature extraction and face recognition techniques could be integrated into the system.

The above-described hardware description is a non-limiting example of corresponding structure for performing the functionality described herein.

Numerous modifications and variations of the present disclosure are possible in light of the above teachings. It is therefore to be understood that the invention may be practiced otherwise than as specifically described herein.

The invention claimed is:

1. A method for producing light of a specified wavelength, comprising:
    irradiating a dye solution present in a cuvette with a semiconductor diode laser source to emit a laser light including an output wavelength of light;
    modulating the laser light with an optical chopper;
    shaping the laser light with a cylindrical lens;
    rotating the cuvette, during the irradiating, with a rotator to mix the dye solution;
    controlling the temperature of the cuvette, during the irradiating, with an active temperature control apparatus;
    transmitting the output wavelength of light using a grating to produce an output light; and
    directing the output light toward a target,
    wherein the dye solution comprises a natural oil selected from the group consisting of moringa, avocado, almond, castor, pumpkin, lemon, and combinations thereof, in a major amount, and a dye.

2. The method of claim 1, wherein the oil is lemon oil and the dye is poly(9,9-didodecylfluorenyl-2,7-diyl)-end-capped with dimethylphenyl.

3. The method of claim 2, wherein the concentration of poly(9,9-didodecylfluorenyl-2,7-diyl)-end-capped with dimethylphenyl in the lemon oil is in a range from 1 to 3 µg/mL.

4. The method of claim 2, wherein the temperature is 20° C. and there is a measurable amplified spontaneous emission (ASE) intensity.

5. The method of claim 2, wherein the temperature is 80° C. and the ASE intensity is greater than or equal to 105% of the ASE intensity at 20° C.

6. The method of claim 2, wherein the temperature is 100° C. and the ASE intensity is greater than or equal to 115% of the ASE intensity at 20° C.

7. The method of claim 2, wherein the temperature is 130° C. and the ASE intensity is greater than or equal to 120% of the ASE intensity at 20° C.

8. The method of claim 2, wherein the temperature is 170° C. and the ASE intensity is greater than or equal to 125% of the ASE intensity at 20° C.

9. The method of claim 2, further comprising maintaining photochemical stability for 2000 or greater pulses, where the photochemical stability is defined as maintaining an ASE at greater than or of equal to 95% of an initially measured value.

10. The method of claim 9, wherein the photochemical stability is maintained for 3000 or greater pulses.

11. The method of claim 10, wherein the photochemical stability is maintained for 4000 or greater pulses.

12. The method of claim 1, wherein the oil is castor oil and the dye is rhodamine B.

13. The method of claim 12, wherein the concentration of rhodamine B in castor oil is in a range from 1 to 3 µg/mL.

14. A system for producing a light of a specified wavelength, comprising:
    a semiconductor diode laser source,
    an optical chopper,
    a cylindrical lens,
    a dye preparation unit,
    a grating, and
    a dye solution pump;
    wherein the semiconductor diode laser source is configured to emit and direct laser light toward the optical chopper;
    wherein the optical chopper is configured to modulate the laser light by pulsing the light at intervals and to direct the laser light toward the cylindrical lens;
    wherein the cylindrical lens is configured to shape the laser light and direct the laser light toward the dye preparation unit;
    wherein the dye preparation unit comprises:
        a cuvette, loaded with a dye solution, which comprises a dye dissolved in an oil selected from the group consisting of moringa, avocado, almond, castor, pumpkin, lemon, and combinations thereof;

a rotator, wherein the rotator is configured to rotate the cuvette; and an active temperature control apparatus configured to monitor and maintain a stable temperature within the cuvette utilizing active heating and cooling;

wherein the dye preparation unit is configured such that the laser light passes through the dye solution and excites the dye, thereby emitting dye-emitted light and the laser light and the dye-emitted light combine to produce an enriched laser light;

wherein the grating is configured to selectively transmit a desired wavelength of light to produce an output light, and direct the output light toward a target; and wherein the dye solution pump is configured to pump dye solution from a dye solution reservoir, through a sample line, through the cuvette, through a waste line, and into to a waste container.

15. The system of claim 14, wherein the oil is lemon oil and the dye is poly(9,9-didodecylfluorenyl-2,7-diyl)-end-capped with dimethylphenyl.

16. The system of claim 15, wherein the concentration of poly(9,9-didodecylfluorenyl-2,7-diyl)-end-capped with dimethylphenyl in the lemon oil is in a range from 1 to 3 µg/mL.

17. The system of claim 15, wherein the system is capable of maintaining photochemical stability for 2000 or greater pulses, where the photochemical stability is defined as maintaining an ASE at greater than or of equal to 95% of an initially measured value.

18. The system of claim 17, wherein the photochemical stability is maintained for 4000 or greater pulses.

19. The system of claim 14, wherein the oil is castor oil and the dye is rhodamine B.

20. The system of claim 19, wherein the concentration of rhodamine B in castor oil is in a range from 1 to 3 µg/mL.

* * * * *